(12) United States Patent
Vora

(10) Patent No.: US 7,745,301 B2
(45) Date of Patent: Jun. 29, 2010

(54) METHODS AND APPARATUS FOR HIGH-DENSITY CHIP CONNECTIVITY

(75) Inventor: Madhukar B. Vora, Los Gatos, CA (US)

(73) Assignee: Terapede, LLC, Richardson, TX (US)

( * ) Notice: Subject to any disclaimer, the term of this patent is extended or adjusted under 35 U.S.C. 154(b) by 429 days.

(21) Appl. No.: 11/507,888

(22) Filed: Aug. 21, 2006

(65) Prior Publication Data

US 2007/0042529 A1    Feb. 22, 2007

Related U.S. Application Data

(60) Provisional application No. 60/709,896, filed on Aug. 22, 2005.

(51) Int. Cl.
| H01L 21/76 | (2006.01) |
|---|---|
| H01L 21/78 | (2006.01) |
| H01L 21/46 | (2006.01) |
| H01L 21/50 | (2006.01) |
| H01L 21/48 | (2006.01) |
| H01L 21/44 | (2006.01) |

(52) U.S. Cl. .................. 438/401; 438/462; 438/108; 438/975; 257/777; 257/E23.179

(58) Field of Classification Search ................ 438/401, 438/462, 108, 975; 257/777, E23.179
See application file for complete search history.

(56) References Cited

U.S. PATENT DOCUMENTS

| 3,401,126 A | 9/1968 | Miller et al. |
|---|---|---|
| 3,429,040 A | 2/1969 | Miller |
| 3,458,925 A | 8/1969 | Napier et al. |

(Continued)

FOREIGN PATENT DOCUMENTS

EP    0 841 700 A2    5/1998

(Continued)

OTHER PUBLICATIONS

D.W. de Lima Monteiro, O. Akhzar-Mehr, P.M. Sarro and G. Vdovin Electronic Instrumentation Laboratory, "*Single-mask micro fabrication of aspherical optics using KOH anisotropic etching of Silicon,*" Delft University of Technology, Mekelweg 4, 2628 CD Delft, The Netherlands, Optics Express, vol. 11, No. 18, Sep. 8, 2003, 9 pages.

(Continued)

*Primary Examiner*—Luan C Thai
(74) *Attorney, Agent, or Firm*—Fish & Richardson P.C.

(57) ABSTRACT

Self-alignment structures, such as micro-balls and V-grooves, may be formed on chips made by different processes. The self-alignment structures may be aligned to mask layers within an accuracy of one-half the smallest feature size inside a chip. For example, the alignment structures can align an array of pads having a pitch of 0.6 microns, compared to a pitch of 100 microns available with today's Ball Grid Array (BGA) technology. As a result, circuits in the mated chips can communicate via the pads with the same speed or clock frequency as if in a single chip. For example, clock rates between interconnected chips can be increased from 100 MHz to 4 GHz due to low capacitance of the interconnected pads. Because high-density arrays of pads can interconnect chips, chips can be made smaller, thereby reducing cost of chips by order(s) of magnitude.

30 Claims, 17 Drawing Sheets

U.S. PATENT DOCUMENTS

| | | |
|---|---|---|
| 3,486,223 A | 12/1969 | Butera |
| 3,591,839 A | 7/1971 | Evans |
| 3,621,565 A | 11/1971 | Sandstrom et al. |
| 3,811,186 A | 5/1974 | Larnerd et al. |
| 3,871,015 A | 3/1975 | Lin et al. |
| 3,921,285 A | 11/1975 | Krall |
| 3,988,619 A | 10/1976 | Malaviya et al. |
| 3,997,963 A | 12/1976 | Riseman |
| 4,032,372 A | 6/1977 | Vora |
| T964,009 I4 | 11/1977 | Chiu et al. |
| 4,155,155 A | 5/1979 | Bourdon et al. |
| 4,168,999 A | 9/1979 | Vora et al. |
| 4,184,043 A | 1/1980 | Hildering |
| 4,322,882 A | 4/1982 | Vora |
| 4,374,011 A | 2/1983 | Vora et al. |
| 4,398,338 A | 8/1983 | Tickle et al. |
| 4,418,468 A | 12/1983 | Vora et al. |
| 4,425,379 A | 1/1984 | Vora et al. |
| 4,435,790 A | 3/1984 | Tickle et al. |
| 4,488,350 A | 12/1984 | Vora et al. |
| 4,503,598 A | 3/1985 | Vora et al. |
| 4,512,075 A | 4/1985 | Vora |
| 4,543,595 A | 9/1985 | Vora |
| 4,545,113 A | 10/1985 | Vora |
| 4,545,610 A | 10/1985 | Lakritz et al. |
| 4,584,594 A | 4/1986 | Vora et al. |
| 4,617,071 A | 10/1986 | Vora |
| 4,622,575 A | 11/1986 | Vora et al. |
| 4,624,863 A | 11/1986 | Vora |
| 4,628,339 A | 12/1986 | Vora et al. |
| 4,640,004 A | 2/1987 | Thomas et al. |
| 4,757,027 A | 7/1988 | Vora |
| 4,762,801 A | 8/1988 | Kapoor |
| 4,764,480 A | 8/1988 | Vora |
| 4,807,021 A | 2/1989 | Okumura |
| 4,829,363 A | 5/1989 | Thomas et al. |
| 4,878,611 A * | 11/1989 | LoVasco et al. ........ 228/180.22 |
| 4,908,679 A | 3/1990 | Vora et al. |
| 4,947,230 A | 8/1990 | Kapoor |
| 4,949,148 A | 8/1990 | Bartelink |
| 4,974,046 A | 11/1990 | Vora |
| 4,982,244 A | 1/1991 | Kapoor |
| 5,014,107 A | 5/1991 | Vora |
| 5,045,916 A | 9/1991 | Vor et al. |
| 5,055,418 A | 10/1991 | Vora |
| 5,061,986 A | 10/1991 | Vora et al. |
| 5,063,168 A | 11/1991 | Vora |
| 5,072,275 A | 12/1991 | Vora |
| 5,098,854 A | 3/1992 | Kapoor et al. |
| 5,100,824 A | 3/1992 | Vora |
| 5,166,094 A | 11/1992 | Kapoor |
| 5,166,767 A | 11/1992 | Kapoor et al. |
| 5,214,308 A * | 5/1993 | Nishiguchi et al. .......... 257/692 |
| 5,227,316 A | 7/1993 | Vora et al. |
| 5,229,307 A | 7/1993 | Vora et al. |
| 5,240,511 A | 8/1993 | Kapoor |
| 5,340,762 A | 8/1994 | Vora |
| 5,355,035 A | 10/1994 | Vora et al. |
| 5,391,505 A | 2/1995 | Kapoor |
| 5,393,712 A | 2/1995 | Rostoker et al. |
| 5,397,943 A | 3/1995 | West et al. |
| 5,406,133 A | 4/1995 | Vora et al. |
| 5,424,245 A | 6/1995 | Gurtler et al. |
| 5,470,801 A | 11/1995 | Kapoor et al. |
| 5,472,901 A | 12/1995 | Kapoor |
| 5,477,086 A | 12/1995 | Rostoker et al. |
| 5,494,859 A | 2/1996 | Kapoor |
| 5,498,558 A | 3/1996 | Kapoor |
| 5,521,108 A | 5/1996 | Rostoker et al. |
| 5,521,117 A | 5/1996 | Kapoor |
| 5,523,600 A | 6/1996 | Kapoor |
| 5,539,246 A | 7/1996 | Kapoor |
| 5,543,643 A | 8/1996 | Kapoor |
| 5,570,059 A | 10/1996 | Vora et al. |
| 5,583,062 A | 12/1996 | Kapoor |
| 5,598,026 A | 1/1997 | Kapoor et al. |
| 5,614,428 A | 3/1997 | Kapoor |
| 5,631,176 A | 5/1997 | Kapoor |
| 5,631,581 A | 5/1997 | Rostoker et al. |
| 5,640,049 A | 6/1997 | Rostoker et al. |
| 5,644,152 A | 7/1997 | Rostoker et al. |
| 5,650,648 A | 7/1997 | Kapoor |
| 5,650,653 A | 7/1997 | Rostoker et al. |
| 5,654,563 A | 8/1997 | Rostoker et al. |
| 5,656,850 A | 8/1997 | Kapoor |
| 5,663,076 A | 9/1997 | Rostoker et al. |
| 5,663,590 A | 9/1997 | Kapoor |
| 5,668,495 A | 9/1997 | Vora et al. |
| 5,670,393 A | 9/1997 | Kapoor |
| 5,674,774 A | 10/1997 | Pasch et al. |
| 5,698,468 A | 12/1997 | Kapoor |
| 5,719,733 A | 2/1998 | Wei et al. |
| 5,742,086 A | 4/1998 | Rostoker et al. |
| 5,756,395 A | 5/1998 | Rostoker et al. |
| 5,761,110 A | 6/1998 | Irrinki et al. |
| 5,763,302 A | 6/1998 | Kapoor |
| 5,770,492 A | 6/1998 | Kapoor |
| 5,771,187 A | 6/1998 | Kapoor |
| 5,777,360 A | 7/1998 | Rostoker et al. |
| 5,780,347 A | 7/1998 | Kapoor |
| 5,780,350 A | 7/1998 | Kapoor |
| 5,784,328 A | 7/1998 | Irrinki et al. |
| 5,789,770 A | 8/1998 | Rosoker et al. |
| 5,789,783 A | 8/1998 | Choudhury et al. |
| 5,801,422 A | 9/1998 | Rostoker et al. |
| 5,808,330 A | 9/1998 | Rostoker et al. |
| 5,808,932 A | 9/1998 | Irrinki et al. |
| 5,822,214 A | 10/1998 | Rostoker et al. |
| 5,834,821 A | 11/1998 | Rostoker et al. |
| 5,835,986 A | 11/1998 | Wei et al. |
| 5,847,990 A | 12/1998 | Irrinki et al. |
| 5,864,165 A | 1/1999 | Rostoker et al. |
| 5,864,172 A | 1/1999 | Kapoor et al. |
| 5,867,423 A | 2/1999 | Kapoor et al. |
| 5,872,380 A | 2/1999 | Rostoker et al. |
| 5,877,045 A | 3/1999 | Kapoor |
| 5,889,329 A | 3/1999 | Rostoker et al. |
| 5,943,576 A | 8/1999 | Kapoor |
| 5,973,376 A | 10/1999 | Rostoker et al. |
| 5,982,659 A | 11/1999 | Irrinki et al. |
| 5,985,746 A | 11/1999 | Kapoor |
| 6,002,268 A | 12/1999 | Sasaki et al. |
| 6,005,264 A | 12/1999 | Kapoor |
| 6,025,736 A | 2/2000 | Vora et al. |
| 6,084,308 A | 7/2000 | Kelkar et al. |
| 6,097,073 A | 8/2000 | Rostoker et al. |
| 6,109,775 A | 8/2000 | Tripathi et al. |
| 6,117,736 A | 9/2000 | Kapoor |
| 6,121,794 A | 9/2000 | Kapoor |
| 6,188,138 B1 * | 2/2001 | Bodo et al. .................. 257/778 |
| 6,271,110 B1 * | 8/2001 | Yamaguchi et al. ......... 438/613 |
| 6,300,663 B1 | 10/2001 | Kapoor |
| 6,303,995 B1 | 10/2001 | Kapoor et al. |
| 6,312,980 B1 | 11/2001 | Rostoker et al. |
| 6,316,318 B1 | 11/2001 | Kapoor |
| 6,407,434 B1 | 6/2002 | Rostoker et al. |
| 6,418,353 B1 | 7/2002 | Rostoker et al. |
| 6,529,400 B1 | 3/2003 | Bhavnagarwala et al. |
| 6,643,434 B2 * | 11/2003 | Cayrefourcq et al. ......... 385/52 |
| 6,741,122 B2 | 5/2004 | Kapoor et al. |
| 6,825,567 B1 | 11/2004 | Wang et al. |
| 6,861,739 B1 | 3/2005 | Bhavnagarwala et al. |
| 6,897,520 B2 | 5/2005 | Vora |
| RE38,900 E | 11/2005 | Rostoker et al. |

| | | |
|---|---|---|
| 6,965,166 B2 * | 11/2005 | Hikita et al. .............. 257/777 |
| 7,071,734 B2 | 7/2006 | Kapoor |
| 7,224,205 B2 | 5/2007 | Kapoor |
| 7,375,402 B2 | 5/2008 | Kapoor |
| 7,453,107 B1 | 11/2008 | Kapoor |
| 7,474,125 B2 | 1/2009 | Kapoor |
| 7,482,642 B2 | 1/2009 | Kapoor |
| 7,525,136 B2 | 4/2009 | Saha et al. |
| 7,525,138 B2 | 4/2009 | Saha et al. |
| 7,525,163 B2 | 4/2009 | Vora |
| 7,531,854 B2 | 5/2009 | Kapoor |
| 7,557,393 B2 | 7/2009 | Vora |
| 7,560,755 B2 | 7/2009 | Kapoor |
| 7,569,873 B2 | 8/2009 | Kapoor |
| 7,586,155 B2 | 9/2009 | Kapoor |
| 7,592,841 B2 | 9/2009 | Kapoor |
| 7,605,031 B1 | 10/2009 | Kapoor |
| 2002/0096703 A1 | 7/2002 | Vora |
| 2003/0034832 A1 | 2/2003 | Kapoor et al. |
| 2004/0070421 A1 | 4/2004 | Kapoor |
| 2005/0102167 A1 | 5/2005 | Kapoor |
| 2006/0006479 A1 | 1/2006 | Kapoor |
| 2006/0006923 A1 | 1/2006 | Kapoor |
| 2006/0151842 A1 | 7/2006 | Kapoor |
| 2006/0202307 A1 | 9/2006 | Kapoor |
| 2007/0004134 A1 | 1/2007 | Vora |
| 2007/0042529 A1 | 2/2007 | Vora |
| 2007/0069306 A1 | 3/2007 | Kapoor et al. |
| 2007/0096144 A1 | 5/2007 | Kapoor |
| 2007/0126478 A1 | 6/2007 | Kapoor |
| 2007/0194416 A1 | 8/2007 | Vora |
| 2007/0229145 A1 | 10/2007 | Kapoor et al. |
| 2007/0247213 A1 | 10/2007 | Kapoor |
| 2007/0262793 A1 | 11/2007 | Kapoor |
| 2007/0284626 A1 | 12/2007 | Vora et al. |
| 2007/0284628 A1 | 12/2007 | Kapoor |
| 2008/0001183 A1 | 1/2008 | Kapoor |
| 2008/0001233 A1 | 1/2008 | Kapoor et al. |
| 2008/0014687 A1 | 1/2008 | Vora et al. |
| 2008/0036009 A1 | 2/2008 | Vora |
| 2008/0093636 A1 | 4/2008 | Vora et al. |
| 2008/0099796 A1 | 5/2008 | Vora |
| 2008/0099873 A1 | 5/2008 | Vora |
| 2008/0128762 A1 | 6/2008 | Vora |
| 2008/0232157 A1 | 9/2008 | Kapoor |
| 2008/0233685 A1 | 9/2008 | Kapoor |
| 2008/0237657 A1 | 10/2008 | Kapoor |
| 2008/0238519 A1 | 10/2008 | Kapoor |
| 2008/0272393 A1 | 11/2008 | Kapoor |
| 2008/0272394 A1 | 11/2008 | Kapoor et al. |
| 2008/0272401 A1 | 11/2008 | Vora et al. |
| 2008/0272402 A1 | 11/2008 | Saha et al. |
| 2008/0272403 A1 | 11/2008 | Saha et al. |
| 2008/0272404 A1 | 11/2008 | Kapoor |
| 2008/0272407 A1 | 11/2008 | Kapoor |
| 2008/0272408 A1 | 11/2008 | Vora |
| 2008/0272409 A1 | 11/2008 | Sonkusale et al. |
| 2008/0272439 A1 | 11/2008 | Kapoor et al. |
| 2009/0011710 A1 | 1/2009 | Kapoor |
| 2009/0017585 A1 | 1/2009 | Kapoor |
| 2009/0039407 A1 | 2/2009 | Vora |
| 2009/0057727 A1 | 3/2009 | Kapoor |
| 2009/0072278 A1 | 3/2009 | Kapoor |
| 2009/0075435 A1 | 3/2009 | Vora |
| 2009/0137088 A1 | 5/2009 | Sonkusale et al. |
| 2009/0142889 A1 | 6/2009 | Vora et al. |
| 2009/0164963 A1 | 6/2009 | Zarkesh-Ha et al. |
| 2009/0168508 A1 | 7/2009 | Kapoor et al. |
| 2009/0174464 A1 | 7/2009 | Kapoor et al. |
| 2009/0184734 A1 | 7/2009 | Kapoor |
| 2009/0204935 A1 | 8/2009 | Vora |
| 2009/0206375 A1 | 8/2009 | Saha et al. |
| 2009/0215234 A1 | 8/2009 | Vora |

FOREIGN PATENT DOCUMENTS

GB  2 274 201 A  7/1997

OTHER PUBLICATIONS

Ichiro Hazeyama, "*Micro-Bump Formation Technology for Flip-Chip LSIs Using Micro-Solder-Ball,*" NEC Res. & Develop., vol. 44, No. 3, Jul. 2003, pp. 219-224.

Travis D. Tran, "*Development of a Fabrication Process for Microfluidic Flow Channels,*" Website: http://www.ece.uci.edu/~melson/UG2000/CHANNEL.htm, Jun. 14, 2004, pp. 1-6.

X. Tan, A. Modafe, R. Hergert, N. Ghalichechian, B. Shapiro, J.S. Baras, and R. Ghodssi, "*Vision-Based Microtribological Characterization of Linear Microball Bearings,*" Proceedings of 2004 ASME/STLE International Joint Tribology Conference, Long Beach, California, Oct. 24-27, 2004, pp. 1-6.

Z. Elalamy, L.M. Landsberger, A. Pandy and M. Kahrizi, "*Anomalies in Modeling of Anisotropic Etching of Silicon: Facet Boundary Effects,*" J. Vac. Sci. Technol. A, vol. 20, No. 6, Nov./Dec. 2002, 7 pages.

Presentation by Professor Nathan Cheung, "*Etching,*" U.C. Berkeley, EECS143, Lecture #15, at least as early as Oct. 15, 2002, 26 pages.

Invitation to Pay Additional Fees for International Application No. PCT/US2006/032592 mailed May 31, 2007 (6 pages).

Notification of Transmittal of the International Search Report and the Written Opinion of the International Searching Authority, or the Declaration (3 pages), International Search Report (6 pages), and Written Opinion of the International Searching Authority (7 pages) for International Application No. PCAT/US2006/032592 dated Sep. 18, 2007.

Notification of Transmittal of the International Search Report and the Written Opinion of the International Searching Authority, or the Declaration (2 pages), International Search Report (6 pages), and Written Opinion of the International Searching Authority (8 pages) for International Application No. PCT/US2006/032592 dated Sep. 19, 2007.

File History for U.S. Appl. No. 11/508,007, filed Aug. 21, 2006.

Final Office Action mailed Feb. 26, 2010 for U.S. Appl. 11/508,007, Filed Aug. 21, 2006.

\* cited by examiner

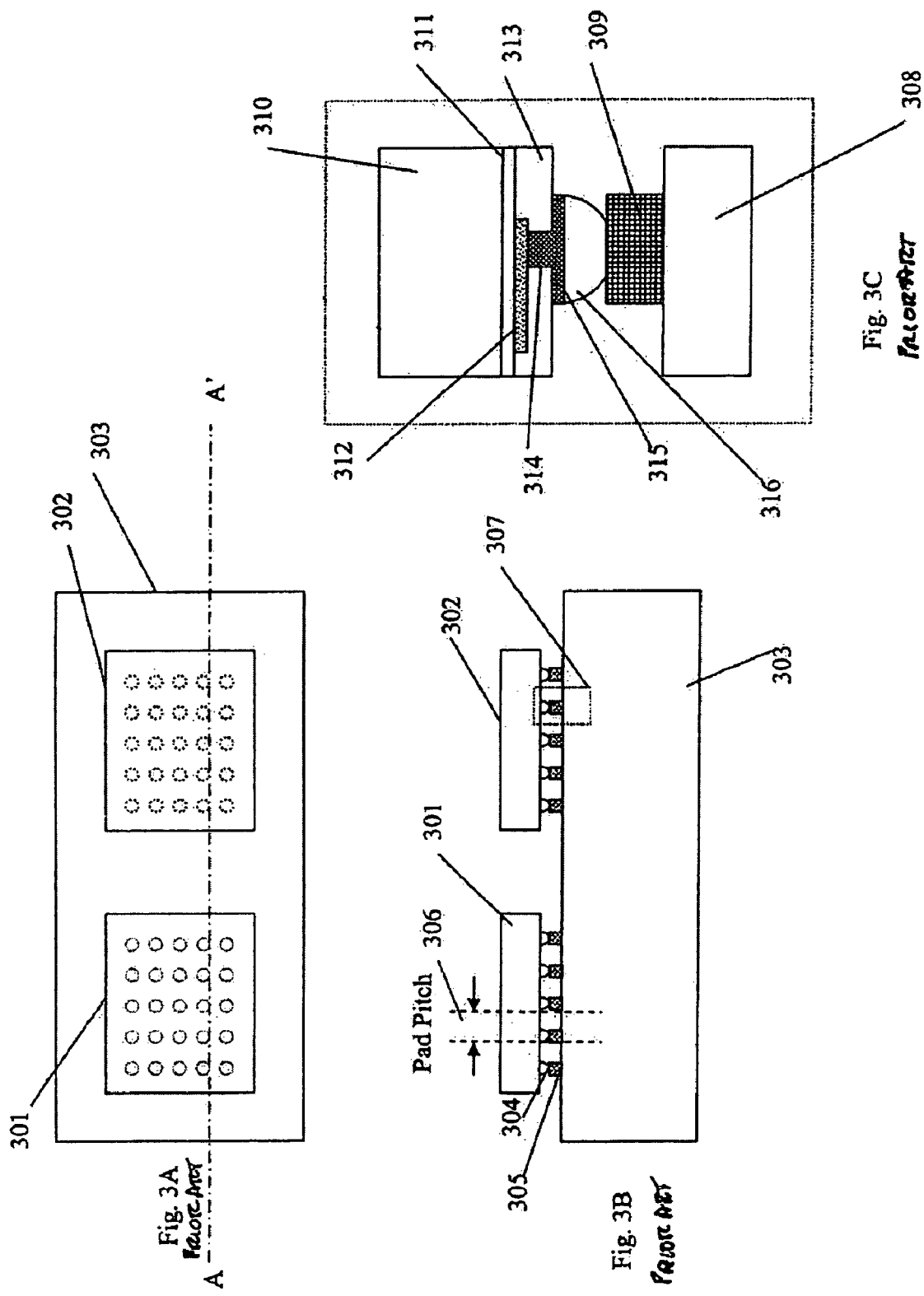

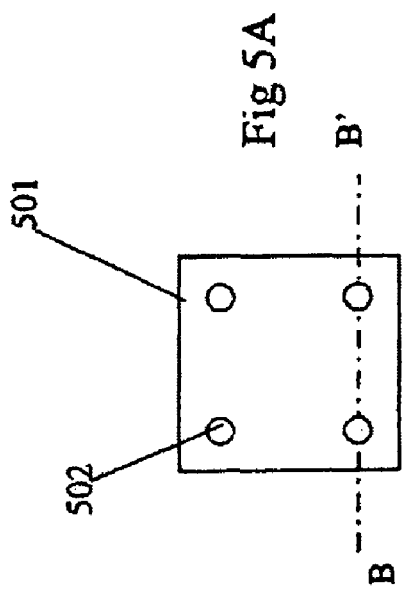
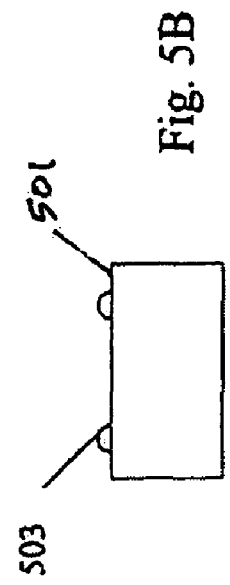
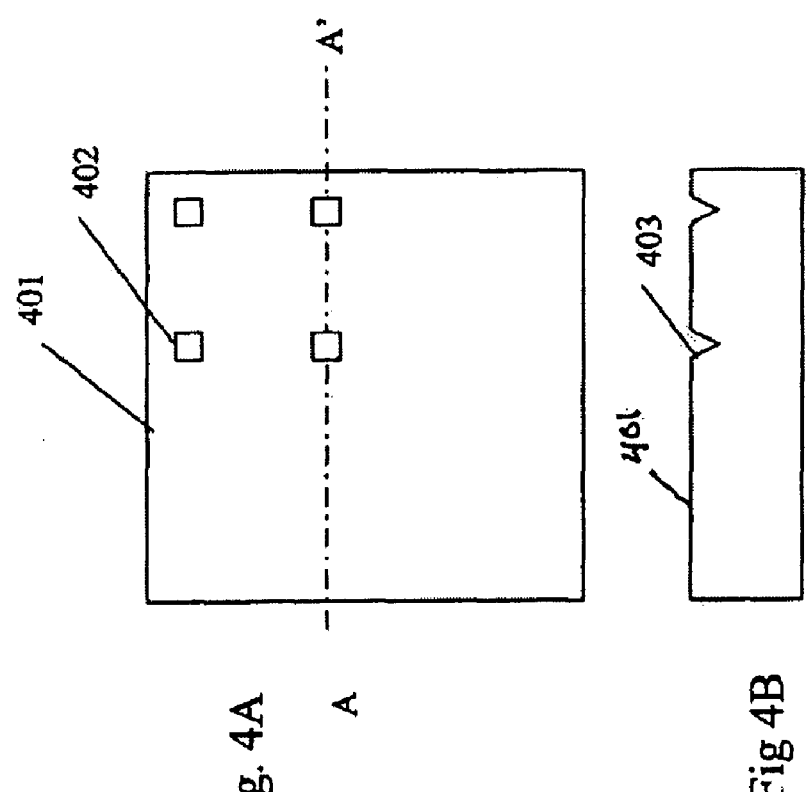
Fig 5A
Fig. 5B
Fig. 4A
Fig 4B

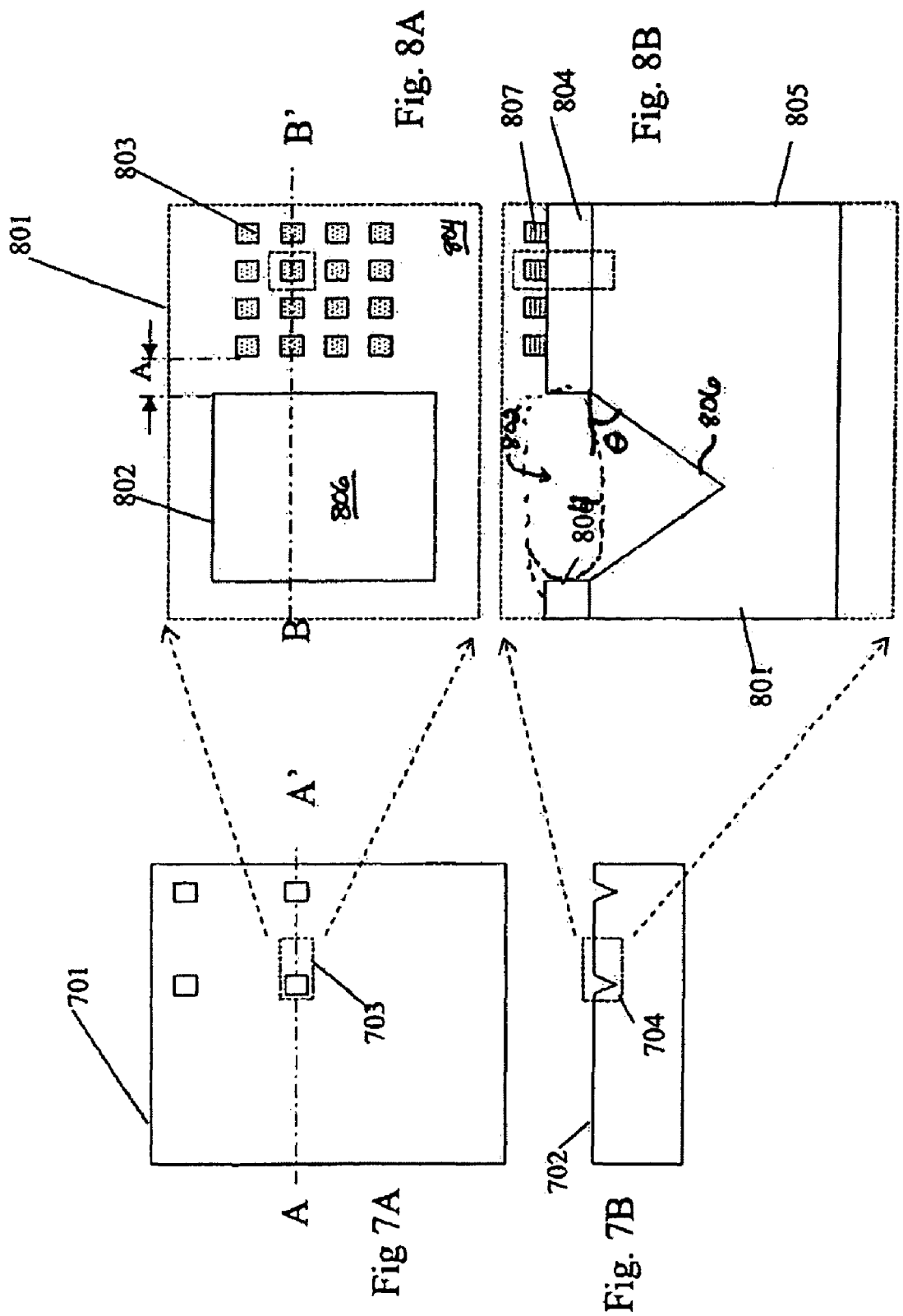

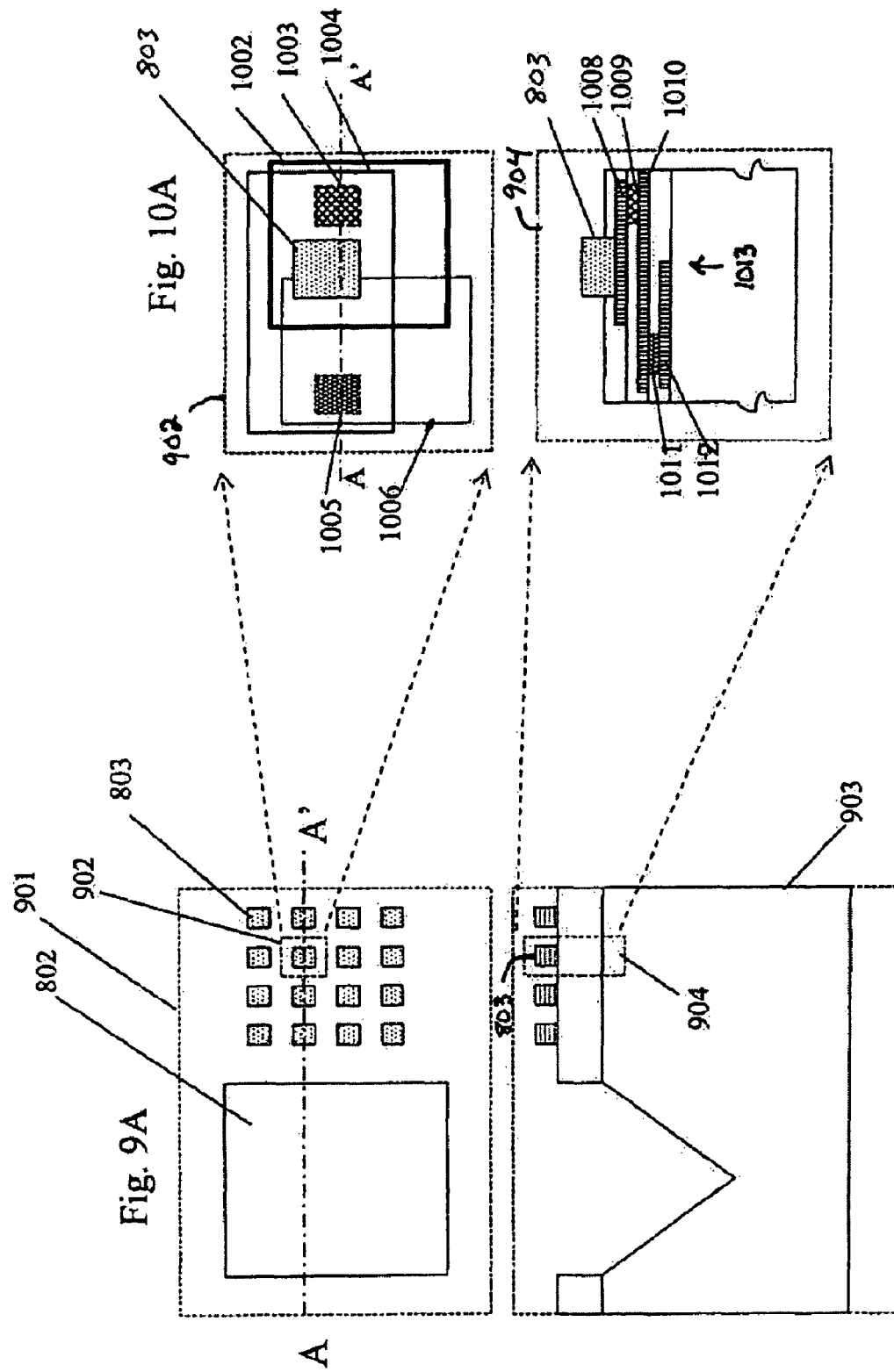

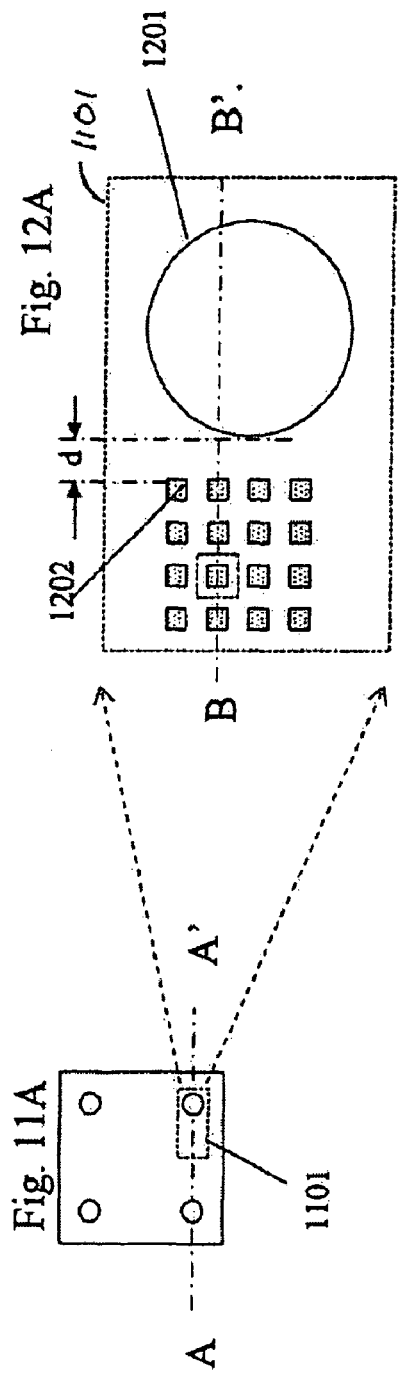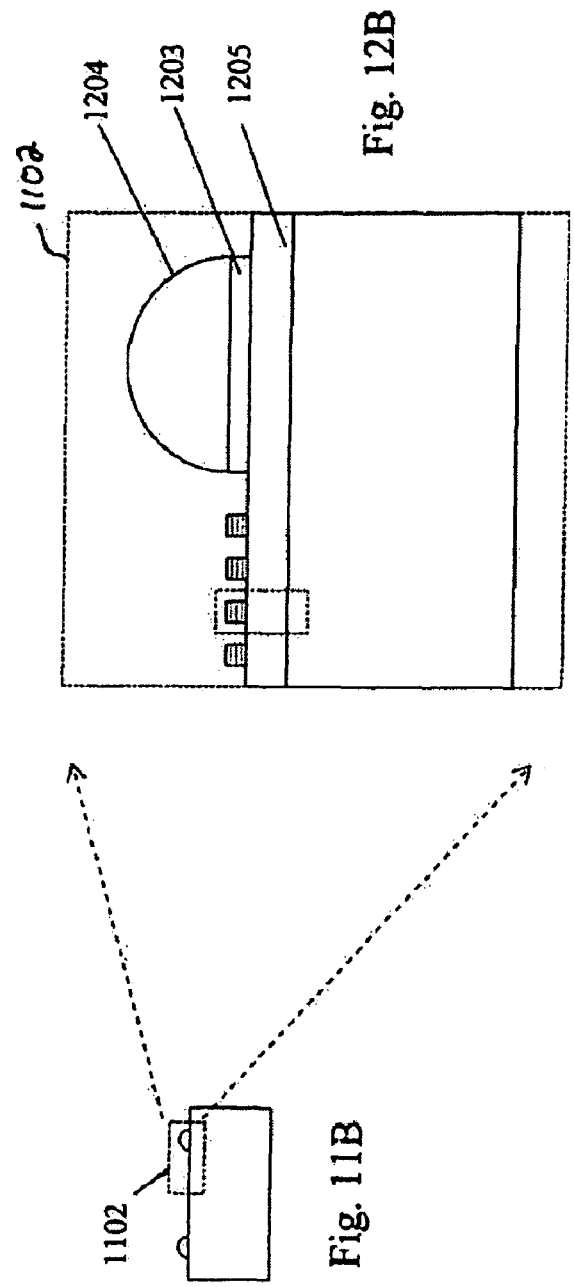

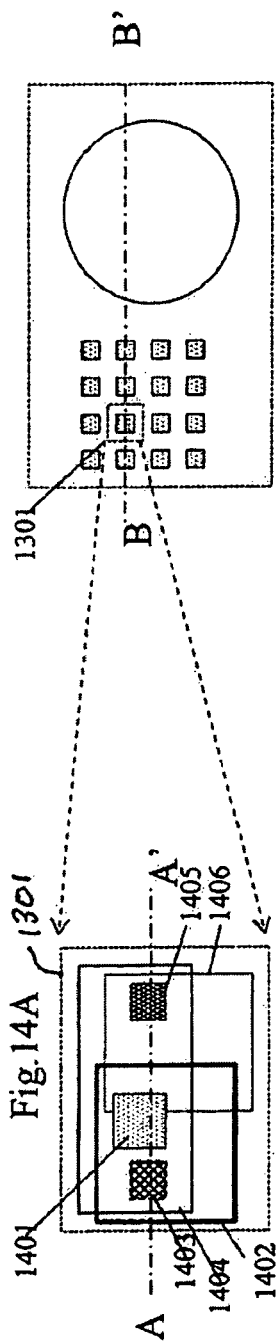
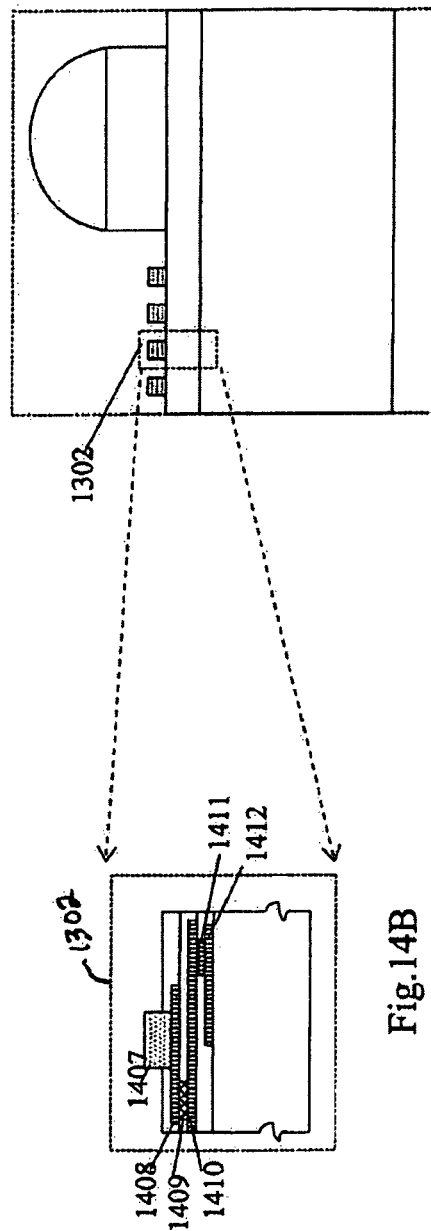

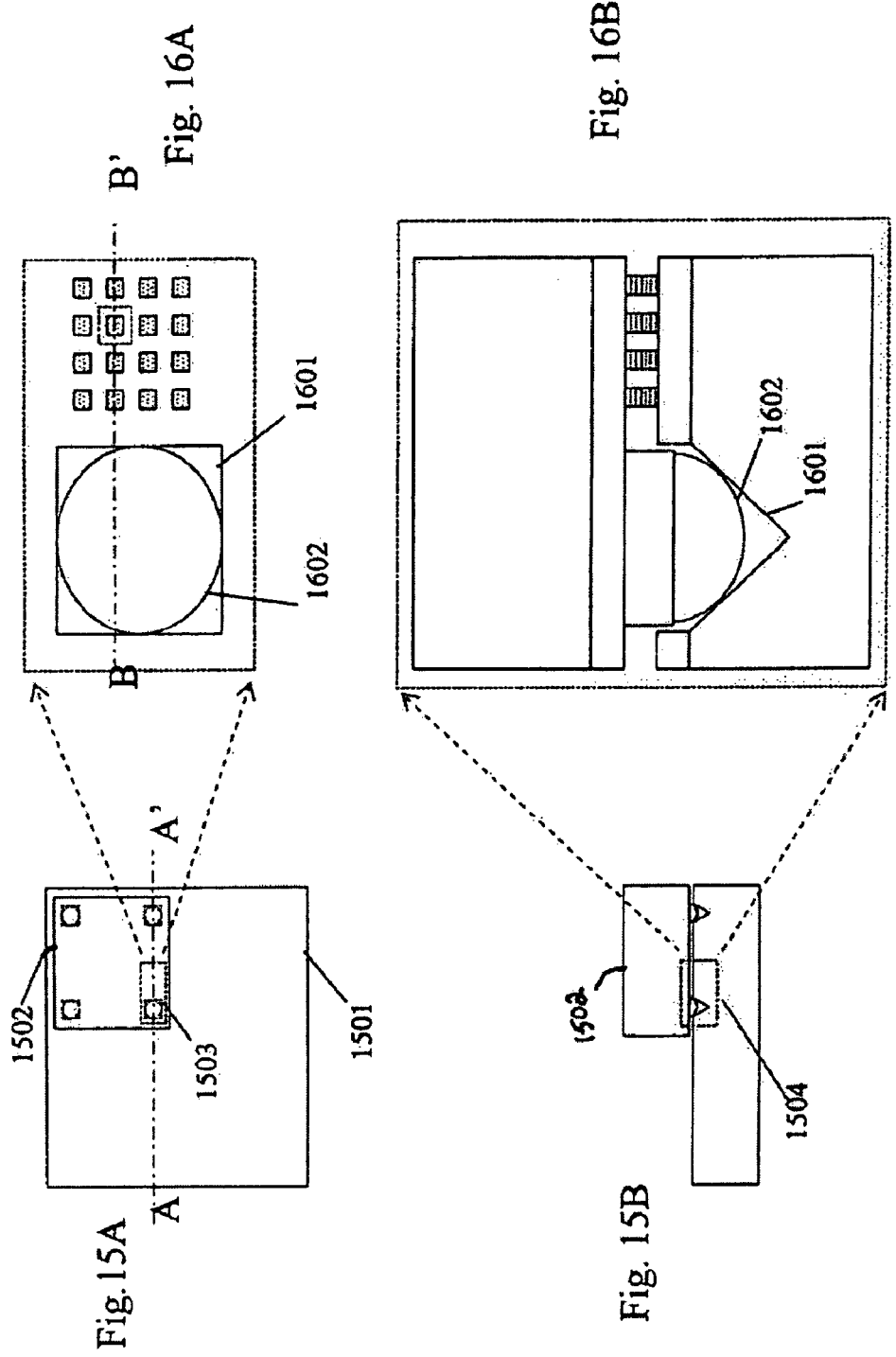

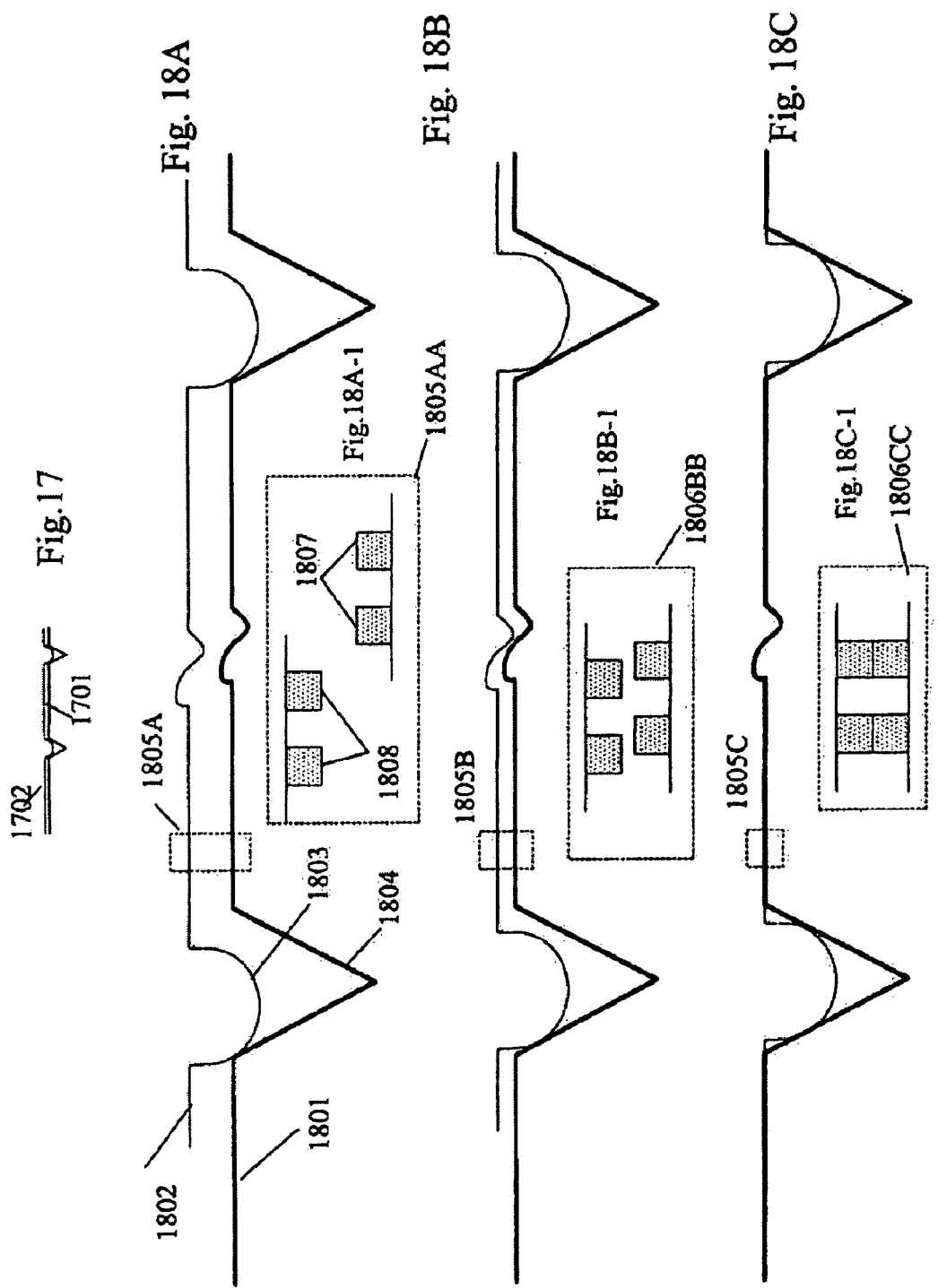

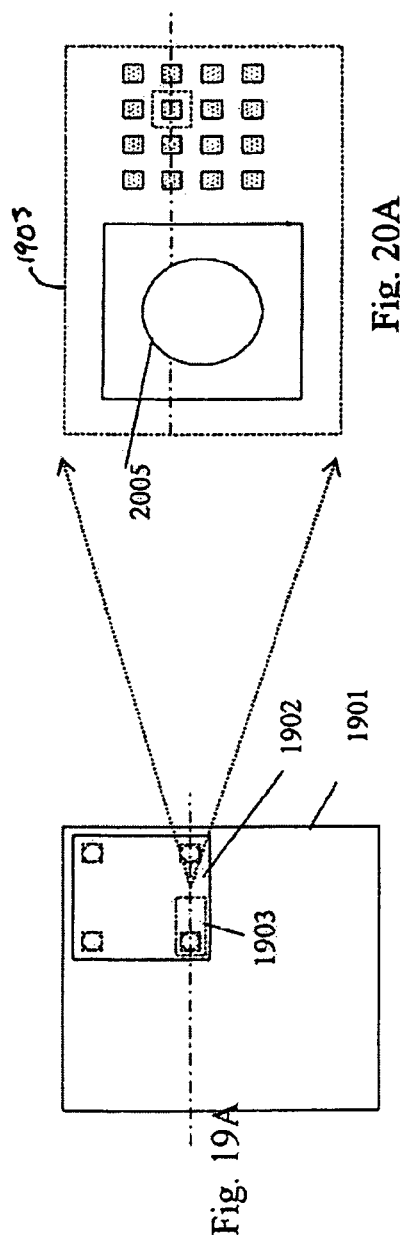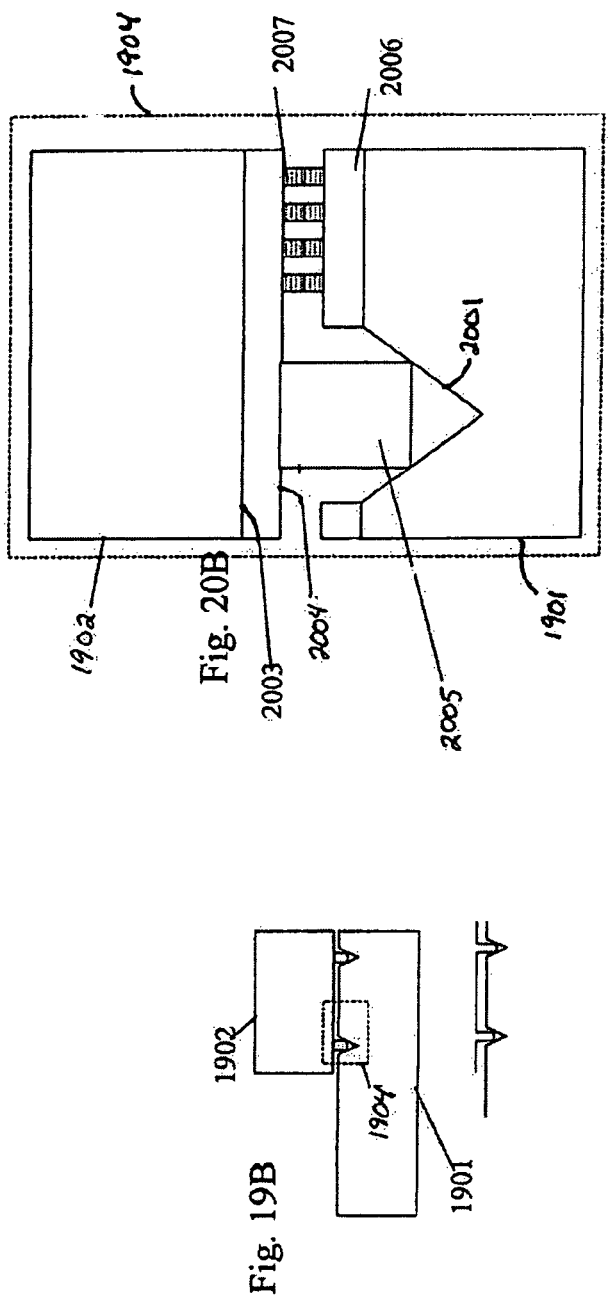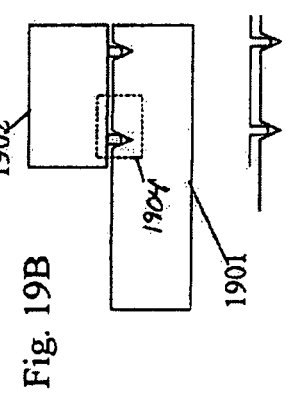

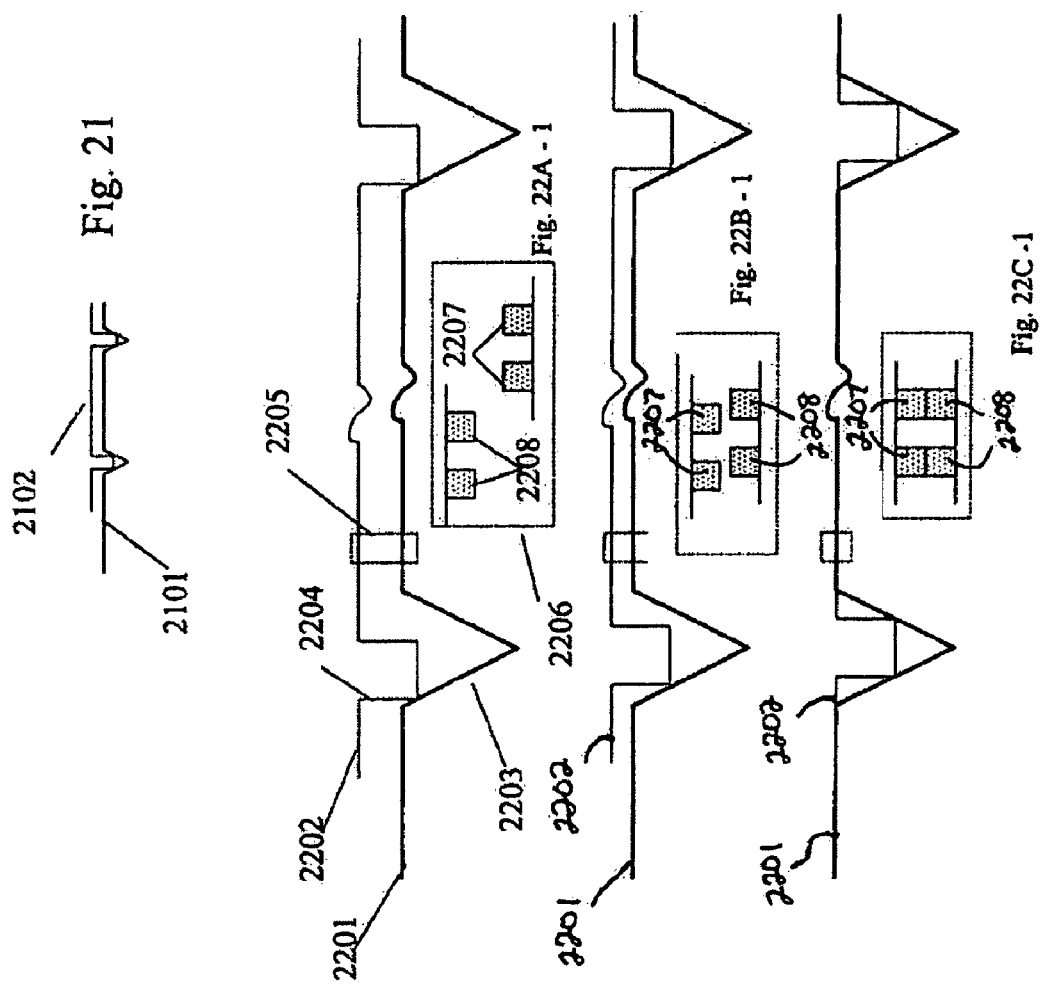

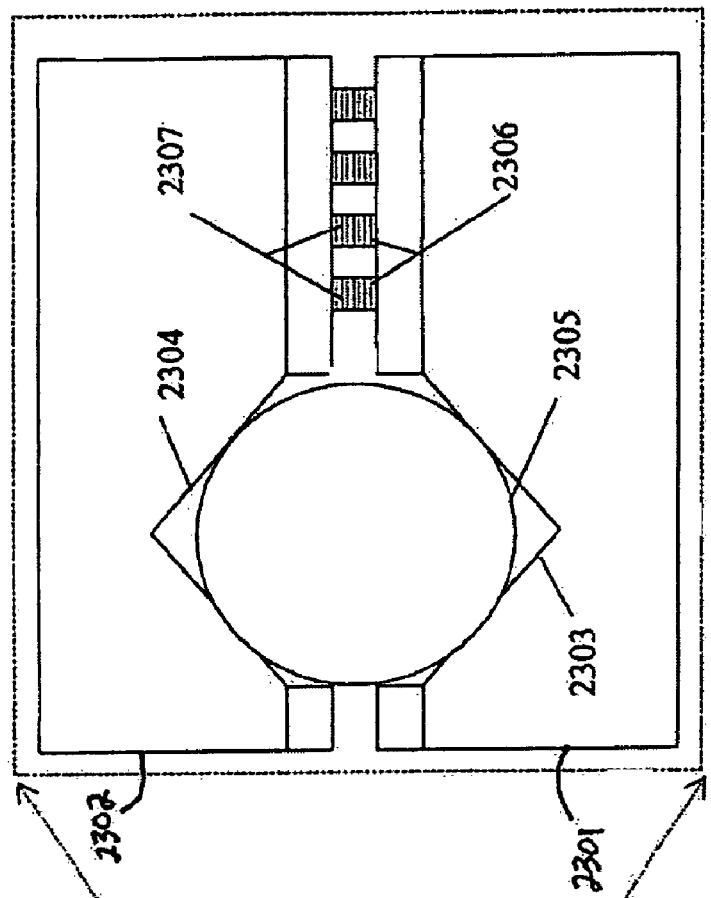
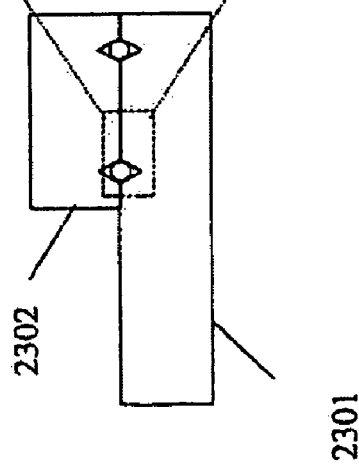

METHODS AND APPARATUS FOR HIGH-DENSITY CHIP CONNECTIVITY

RELATED APPLICATIONS

This application claims the benefit of U.S. Provisional Application No. 60/709,896, filed Aug. 22, 2005. The application entitled "Apparatus and Methods for High-Density Chip Connectivity," and filed the same day as the present application, is incorporated herein by reference in its entirety.

BACKGROUND

A fabrication process of silicon chips is optimized for the type of transistors used for an application. Some of the key processes prevalent today are for logic, Static Random Access Memory (SRAM), Dynamic Random Access Memory (DRAM), flash memory and analog transistors. It is very desirable to have logic and memory, such as DRAM, flash memory, or SRAM on the same chip. Currently, one reason for not combining these example technologies on the same chip is due to the high degree of connectivity (or maximum number of wires) needed between the building blocks that are built with logic and memory on the same chip.

Higher connectivity between circuits yields high performance and low cost. But, it is not practical to integrate logic and memory on the same chip due to major differences in the fabrication processes. So, presently, manufacturers make one chip with logic and another with memory and connect them together with Ball Grid Arrays (BGA's). Connectivity of two chips using a BGA is significantly lower than of connectivity on a single silicon or other material chip. A BGA and its connectivity are described briefly herein to show a mismatch in the connectivity of BGA's and the chip.

FIG. 1A shows a chip 101 with a BGA 102, where each ball 104 of the BGA 102 is a semi-spherical ball 104 disposed on a surface 105 of the chip 101. An area 103 of the BGA 102 is described below in reference to FIG. 1B.

FIG. 1B is a sectional view of the chip 101 of FIG. 1A at AA'. The area 103 shows that a ball 104 of the BGA 102 is raised above the surface 105 of the chip 101.

FIG. 2A is an enlarged top view of the area 103, and FIG. 2B is a sectional view of the area 103, where a section BB' of FIG. 2A is shown in FIG. 2B. Referring to both FIGS. 2A and 2B, a silicon substrate 201 has an insulator 202, such as $SiO_2$. A first metal or aluminum connection 206 is formed on the insulator 202 for providing a chip interconnect. A wire 208 connected to an internal interconnect (not shown) of the chip 101 is connected to a pad 207. An insulator 209 covers the first metal connection 206. A contact hole 203 allows a second metal connection 204 to connect with the first metal connection 206. A semi hemisphere ball 205 is disposed on top of the second metal connection 204. An array of semi-hemisphere balls 205 is formed on the chip 101.

FIG. 3A shows two chips 301 and 302 flipped upside down and placed on a ceramic substrate 303 with a plated interconnect (not shown). FIG. 3B is a sectional view along section AA' of FIG. 3A. Balls 304 on the chips 301, 302 are placed on metal or copper posts 305 on the substrate 303. By heating the whole assembly (i.e., the chips 301, 302 and ceramic substrate 305), the balls 304 are soldered or fused to the posts 305. As shown, the posts 305 have a pitch 306.

FIG. 3C is an enlarged view of an area 307 of FIG. 3B. A ceramic substrate 308 has a copper post 309 that connects to another post (not shown) through copper plated multilevel wiring, as known in the art. Silicon substrate 310 supports an insulation layer 311. A metal connection 312 is covered by an insulator layer 313, which has a contact hole 314. Another metal connection 315, may be formed of copper or gold, for example, and is placed on top of the contact hole 314. A metal semi-hemispheric ball 316 is placed or otherwise set on the metal connection 315. The chip 301 and substrate 308 are aligned so that the ball 316 is on top of the post 309. By heating the assembly of FIG. 3C, the ball 316 is soldered or fused to the post 309. Once soldered, the BGA assembly of two interconnected chips 301 and 302 and the substrate 303 is complete.

The pitch 306 of the posts 305 determines connectivity of the BGA. State of the art pitch 'p' is 4 mil or 100 microns. The connectivity 'C' is defined as a maximum number of wires that can connect two chips 301 and 302. C is equal to $1/p^2$, which is $1E04/cm^2$ for BGA's. On the other hand, connectivity of a state of the art silicon chip is significantly larger. In a silicon chip, if a feature size of a CMOS process is 'F', then the number of via connections on the top layer of the chip determines the connectivity of the chip. The connectivity C for a chip is $1/(2F^2)$. For a state of the art CMOS process, the feature size F is 100 nm. So the maximum connectivity for a chip is $1E12/cm^2$.

The gap between the connectivity of a BGA and that of a chip is very large. In addition to connectivity, the capacitances at the output of the BGA, ceramic substrate posts and plated interconnects are very high and cause significant delay in signals going from one chip 301 to another 302. These delays limit the clock rate 'f' at which signals can travel between logic and memory chips. The best clock rate possible for BGA's is 100 MHz at commonly used TTL signal levels as compared to clock rates 'f' of 1 GHz within a 90 nm CMOS chip. Lower clock rates and low connectivity result in lower bandwidth for a signal to be transferred between logic on one chip 301 (FIG. 3B) and memory on another chip 302 (FIG. 3B). If logic and memory are on the same chip, data bandwidth can be increased by a ratio:

$$R = (f_{chip} \times C_{chip})/(f_{BGA} \times C_{BGA}),$$

where $f_{chip}$ is a clock rate possible in a within a chip (e.g., 4 GHz in 100 nm CMOS), $C_{chip}$ is connectivity within a chip (e.g., $1E12/cm^2$), $f_{BGA}$ is clock rate possible within a BGA assembly (e.g., 100 MHz), and $C_{BGA}$ is connectivity of a BGA assembly (e.g., $1E04/cm^2$). Hence, ratio R=1E08. Such a high ratio can open up many areas of applications, which are not possible today through the use of BGA technology or other chip interconnect technologies.

SUMMARY

To overcome the problems of chip-to-chip interconnectivity bandwidth and connectivity limitations, the principles of the present invention provide for self-alignment structures, such as micro-balls and V-grooves, to be formed on chips made by different processes. The self-alignment structures may be aligned to mask layers within an accuracy of one-half the smallest feature size inside a chip. For example, the alignment structures can align an array of pads having a pitch of 0.6 microns, compared to a pitch of 100 microns available with today's Ball Grid Array (BGA) technology. As a result, circuits in the mated chips can communicate via the pads with the same speed or clock frequency as if in a single chip. For example, clock rates between interconnected chips can be increased from 100 MHz to 4 GHz due to low capacitance of the interconnected pads. Because high-density arrays of pads can interconnect chips, chips can be made smaller, thereby reducing cost of chips by order(s) of magnitude.

One embodiment includes a first chip formed by a first process and a second chip formed by a second process. The first chip may include first conductive pads and first alignment structure(s). The second chip may include second conductive pads and second alignment structure(s). The first and second alignment structure(s) may be positionally aligned, thereby causing at least a subset of the first and second conductive pads to be aligned.

Another embodiment may include an electronic chip, including a substrate, an electronic circuit formed on the substrate, and conductive pads formed on the substrate and connected to the electronic circuit. The conductive pads may have a pitch less than approximately 100 microns.

In another embodiment, an electronic chip may include a substrate, an electronic circuit formed on the substrate, and conductive pads formed on the substrate and connected to said electronic circuit, said conductive pads covering a surface area less than approximately 10 square microns on the substrate.

In yet another embodiment, a method of manufacturing a chip may include forming (i) first electrical components, (ii) a plurality of first conductive pads, and (iii) at least one first alignment structure on a first substrate using a first chip manufacturing process. The first alignment structure(s) may be arranged to be aligned with at least one second alignment structure on a second substrate having second conductive pads disposed thereon by a second chip manufacturing process.

In still another embodiment, a method for aligning a first and second chip may include contacting at least one first self-alignment feature of a first chip with at least one second self-alignment feature of a second chip. The first and second chips may be moved relative to each other to enable the first and second self-alignment feature(s) to self-align.

Another embodiment may include a method of aligning a first chip with a second chip, including positioning a first chip including first alignment feature(s) and first conductive pads, positioning a second chip including second alignment feature(s) and second conductive pads, and moving at least one of the first and second chips relative to the other chip to align the first and second alignment feature(s) to cause at least a subset of the first and second conductive pads to be aligned.

Another embodiment may include a method of communicating signals between chips, including communicating electrical signals between a first and second chip, the electrical signals may pass from a first conductive pad disposed on the first chip to a second conductive pad disposed on the second chip, where the first and second conductive pads are bonded together.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 3A is the top view of two chips packaged on a ceramic substrate using Flip Chip technology;

FIG. 3B is the sectional view of the two chips packaged on the ceramic substrate of FIG. 3A using Flip Chip technology along the section AA';

FIG. 3C is detailed section of view of an area of FIG. 3B showing detail of a connection between one of the chips mounted on the ceramic substrate of FIG. 3A using Flip Chip technology;

FIG. 4A is top view of a first chip with four holes etched in it according to an embodiment of the present invention after wafer processing is complete;

FIG. 4B is a sectional view of the first chip in FIG. 4A along a section AA' illustrating a "V" groove formed using an anisotropic etching process according to an embodiment of the present invention;

FIG. 5A is the top view of a second chip with four pads arranged corresponding to the four holes of the first chip of FIGS. 4A and 4B;

FIG. 5B is a sectional view of the second chip in FIG. 5A along a section AA' illustrating a semi-hemispheric ball 503 constructed on the pad;

FIG. 7A is top view of the first chip of FIG. 4A with four holes etched in it after wafer processing is complete according to an embodiment of the present invention;

FIG. 7B is a sectional view of the first chip of FIG. 4A along a section AA' illustrating a V-groove formed using an anisotropic etch process;

FIG. 8A is an enlarged view of an area of FIG. 7A illustrating details of a position of the V-groove with respect to internal via posts of a chip in which the V-groove is aligned to a via post with an accuracy of 0.5F, where F is equivalent to the smallest features on a chip;

FIG. 8B is an enlarged view of an area of FIG. 7B and a sectional view along section BB' of 8A;

FIG. 9A is an enlarged view of an area 703 of FIG. 7A illustrating details of a position of the V-groove 802 with respect to the internal via posts 803 of a chip in which the V-groove 802 is aligned to the internal via posts 803 with an accuracy of 0.5F, where F is the smallest features on a chip;

FIG. 9B is an enlarged view of an area 704 of FIG. 7B and a sectional view along section AA' of FIG. 9A;

FIG. 10A is an enlarged view of an area 902 of FIG. 9A illustrating details of a multilevel interconnect inside the chip and top post to be connected to a second chip;

FIG. 10B is the enlarged area 904 of FIG. 9B showing details of the multilevel interconnect and top post to be connected to a second chip;

FIG. 11A is the top view of a second chip with four pads arranged to be connected to the V-grooves of the first chip of FIG. 9A;

FIG. 11B is a sectional view of the second chip of FIG. 11A along section AA';

FIG. 12A is an enlarged view of an area 1101 on the second chip of FIG. 11A showing the position of a round pad 1201 and a post 1202 in which the pad and the post are self-aligned with accuracy of 0.5F, where F is the minimum feature size in a chip;

FIG. 12B is an enlarged view of an area 1102 showing a semi-hemispheric ball 1204 coupled to the pad 1203 and the posts inside the second chip of FIG. 11A;

FIG. 13A is an enlarged view of the same area as illustrated in FIG. 12A;

FIG. 13B is an enlarged view of the same area as FIG. 12B;

FIG. 14A is an enlarged view of an area 1301 of FIG. 13A showing details of a multilevel interconnect inside the chip and a top post to be connected to a second chip;

FIG. 14B is an enlarged view of an area 1302 of FIG. 13B showing details of a multilevel interconnect and top post to be connected to a second chip;

FIG. 15A is a top view of an assembly of a first chip mounted on a second chip, similar to the assembly of FIG. 6A;

FIG. 15B is a sectional view of the assembly of FIG. 15A similar to the assembly of FIG. 6B;

FIG. 16A is an enlarged view of an area 1503 of FIG. 15A showing self-aligned first and second chip;

FIG. 16B is an enlarged view of an area 1504 of FIG. 15B showing perfect alignment of a ball and groove and, consequently, perfect alignment of posts on two chips;

FIG. 17 is a profile view of the two chips of FIG. 15B in a face-to-face surface arrangement;

FIG. 18A is an enlarged first profile view of surfaces with rough alignment of a ball and V-groove;

FIG. 18A-1 is a diagram of the position of the posts on both chips when the balls are just inside an edge of the V-grooves;

FIG. 18B is a second profile view in the middle of a slide of the balls along a sloping surface of the V-grooves;

FIG. 18B-1 is a diagram of an alignment of posts in motion as the ball slides along the sloping surface of the V-groove;

FIG. 18C is a third profile view illustrating a self aligned position of the balls in the V-grooves;

FIG. 18C-1 is a diagram illustrating aligned posts as the balls are in a final position in the V-grooves;

FIG. 19A is same as FIG. 6A;

FIG. 19B is same as FIG. 6B;

FIG. 20A is a diagram illustrating an enlarged area of FIG. 19A and a mating pillar;

FIG. 20B is a diagram illustrating an enlarged area of FIG. 19B and showing a cross-section of a pillar and mating posts, where the posts on the two chips are aligned when the pillar has completed sliding along the slope of V-groove and arrived at a final position;

FIG. 21 is a diagram illustrating the profile of surfaces of the faces of the two chips;

FIG. 22A is a diagram illustrating an enlarged profile of surfaces of FIG. 21 when a pillar is just inside a V grove;

FIG. 22A-1 is a diagram that shows a degree of misalignment of posts of two chips;

FIG. 22B is a diagram that shows the profiles in the middle of a slide of a pillar along a sloping surface of a V-groove;

FIG. 22B-1 is a diagram that shows alignment of two chips in motion;

FIG. 22C is a diagram that shows a pillar in a final position and posts in perfect alignment at an end of motion;

FIG. 22C-1 is a diagram illustrating aligned posts as the pillars are in a resting position in the V-grooves.

FIG. 23A is an assembly of two chips and, where both chips have V-grooves, and a micro-ball resides in a cavity formed by two face-to-face V-grooves;

FIG. 23B is a diagram illustrating an enlarged area of FIG. 23A that shows a placement of a micro-ball in a V-groove followed by placement of a second chip with its V-groove self-aligned on the ball with posts being self-aligned;

Like reference symbols in the various drawings indicate like elements.

DETAILED DESCRIPTION OF THE DRAWINGS

An example embodiment of the present invention may be used to assemble two silicon chips made with different processes, such as logic and memory (e.g., DRAM, SRAM, or flash) processes, and allow the two chips to have the same connectivity and speed or clock frequency as available in a single chip. This assembly is accomplished by placing one chip on the top of another and aligning them through a self-aligning technique, which has alignment tolerances that are substantially the same as if both chips were fabricated as a single chip. This results in significantly improved connectivity and speed compared to Ball Grid Array (BGA) flip chip techniques.

Figure 6A:
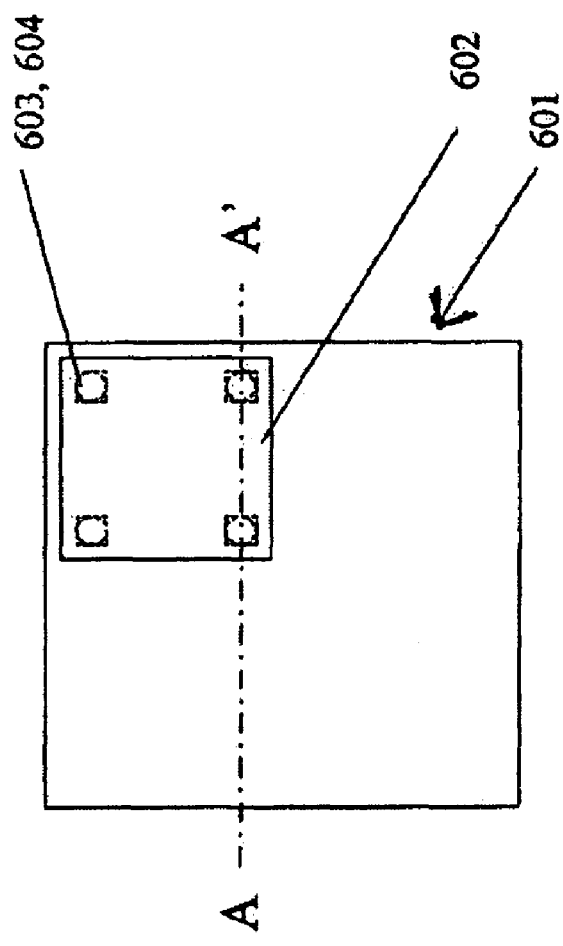
FIG. 6A is a top view of an assembly of the first chip of FIGS. 4A and 4B and the second chip of FIGS. 5A and 5B with the semi-hemispheric ball self-aligned and well-centered in the V-grooves according to an embodiment of the present invention.
Figure 6B:
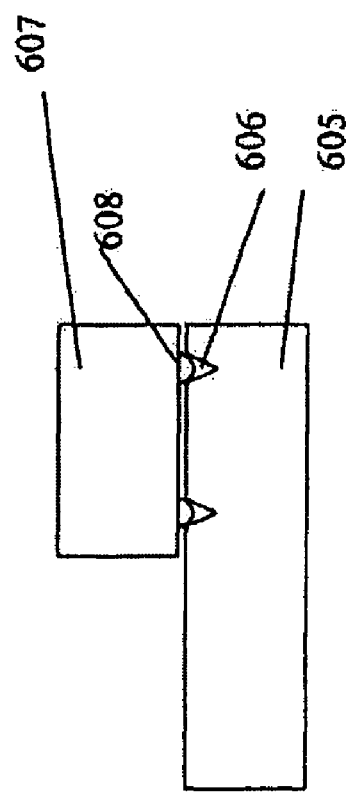
FIG. 6B is a sectional view of the assembly of FIG. 6A along section AA' illustrating balls self-aligned to V-grooves.

In one embodiment, the shape of the ball is uniform from ball to ball for all the balls on the chip. Variation in the diameter of the balls of such an embodiment is expected to be the same as the variation in the size of lithography patterns of metal lines on the chip, which is of the order of 0.5 F, where F is a feature size of a photolithography and etch process that is used to form the balls. For example, for a 1-micron process, variation of the diameter of the ball is less than 0.5 micron. As illustrated in FIGS. 6A and 6B, a second chip with balls is placed on a first chip with indentations such as V-grooves in a face-to-face arrangement and roughly aligned. Once the balls are in the vicinity of the indentations, the balls slide into respective indentations by gravity as in FIGS. 18A, 18B, and 18C.

Before presenting details of multiple example embodiments of the present invention, a brief overview of a few of the example embodiments is presented. The use of KOH for the etching process produces inverted pyramids and cubes depending on crystal orientation of the silicon. Other etching compounds may be used in the etching process as understood in the art. As further understood in the art, the sides of the etched inverted pyramids are substantially flat due to anisotropic etching, which etches in a certain plane <111> or <110> in this case and not in <100>. The sides, in fact, become polished similar to the top surface of the substrate in which the hole is etched. V-grooves may be used because the shape is naturally etched into silicon and the shape is substantially symmetrical, thereby providing for self-alignment and described further herein.

The shape of the hole may be formed as an inverted pyramid that, in a sectional view, looks like a V-groove, as illustrated in FIG. 4B. Sets of four semi-hemispheric balls are formed on a second chip, at the end of wafer processing, using a similar process as used in Flip Chip or Ball Grid Array (BGA) technology (e.g., U.S. Pat. No. 5,424,245) as illustrated in FIGS. 5A and 5B. It should be understood that the balls may alternatively be semi-spherical.

In one embodiment, the shape of the ball is uniform from ball to ball for all the balls on the chip. Variation in the diameter of the balls of such an embodiment is expected to be the same as the variation in the size of lithography patterns of metal lines on the chip, which is of the order of 0.5F, where F is a feature size of a photolithography and etch process that is used to form the balls. For example, for a 1-micron process, variation of the diameter of the ball is less than 0.5 micron. As illustrated in FIGS. 6A and 6B, a second chip with balls is placed on a first chip with indentations such as V-grooves in a face-to-face arrangement and roughly aligned. Once the balls are in the vicinity of the indentations, the balls slide into respective indentations by gravity as in FIGS. 18A, 18B, 18C and 18D.

The description below illustrates embodiments with the indentation being V-grooves. However, it should be understood that other shapes that provide for alignment may be used.

Another embodiment of this invention is shown in FIGS. 19A, 19B, 20A and 20B. Referring to those figures, a first chip has the V-grooves as described above, but a second chip has pillars instead of balls. Pillars are formed using standard silicon technology that includes insulator deposition, photolithography and anisotropic etching of insulator. FIG. 20B shows how the insulator post is positioned in a V-groove at the end of self-aligning the post in the V-groove. FIG. 20B also shows that through the self-alignment process, metal posts at surfaces of both chips get self-aligned to an accuracy of lithography of the process used in fabricating the wafer. So, if feature size F of the wafer is 100 nm, metal posts in FIGS. 20A and 20B are aligned with a tolerance of 50 nm. An example method of self-aligning is shown in FIGS. 22A, 22B and 22C. As illustrated in FIGS. 22A-22C, a top chip with insulator posts is roughly aligned to V-grooves in the bottom chip, and then the top chip is "dropped" on the bottom chip. The posts slide down and settle in a known predetermined position in perfect alignment with the bottom chip. To ensure substantially perfect self-alignment, an ultrasonic vibration may be applied to the chips. It should be noted that insulator pillars and V-grooves have very large dimensions (greater than 100 microns) compared with the metal posts on the chip (less than 100 nm), so that alignment of the insulator post and V-groove can be done in a standard assembly manufacturing line.

Another embodiment of this invention is shown in a sectional view of two chips placed on each other, as illustrated in FIGS. 23A and 23B. In this embodiment, both chips have a set of four holes with V-grooves, as was done in the first chip in the first embodiment. A micro-ball with diameter in the range of 100 microns and a dimension control in the sub-micron range is placed in the bottom chip, as illustrated in FIG. 23B. There are many methods of placing the ball in the V-groove, such as passing a large number of balls over the chip until four balls fall naturally into the four V-grooves. After a ball is in each of the V-grooves, the second chip is placed over the first chip so that V-grooves in the top and bottom chips are roughly aligned. The top chip is allowed to drop so that it slides into a self-aligned position.

Accuracy of the alignment of the metal pads on chips that have a minimum dimension dictated by chip processes is the same as the variations in the diameter of the micro-balls. If alignment accuracy of the micro-balls is 0.1 microns, then metal pad sizes can be as small as 0.3 microns. So, the array of the pads that can be formed between the chips can have a pitch of 0.6 microns, giving a high degree of connectivity compared to a pitch of 200 microns available with BGA technology. The capacitance of the metal pads in FIG. 23B is also very small, just like other parasitic components on the chips. The low capacitance of the pad in FIG. 23B enables the combined chip assembly or device to operate a clock at a very high frequency. In contrast, capacitance of pads on a BGA structure is very high because of large surface areas of the posts, which results in reducing the clock frequency for communications between two chips.

In addition to increasing the connectivity and reducing the pad capacitances, which gives high bandwidth, embodiments of this invention also reduce the cost of the multi-chip module by reducing the component count from 3 to 2 by eliminating the ceramic substrate.

High bandwidth, low cost of integration, and low noise interference supported by embodiments of this invention of integrating two chips are useful for the following exemplary combinations:

1. Logic chip and DRAM chip
2. Logic chip and SRAM chip
3. Logic chip and high frequency analog chip, and
4. Building very large arrays of FPGA chips.

These exemplary combinations can be made without speed or yield loss and without increase in power dissipation. It is well known that the cost of one 9 $cm^2$ chip is significantly higher than integrating nine 1 $cm^2$ chips due to yield limitations. It was not possible before this invention because connectivity of multi-chip modules was extremely low, and capacitance at the BGA pads was too large. Embodiments of this invention enable the same connectivity and capacitances of the interconnect conductive pads as in a single chip, hence ensuring performance. Typically, the cost of one 9 $cm^2$ chip is in thousands of dollars, while the total cost of nine 1 $cm^2$ chips can be less than 100 dollars. Thus, gate density of a FPGA can be increased by an order of magnitude while maintaining low cost.

Embodiments of the invention of the Seamless Integrated Process or SIP described above is described hereinbelow in detail.

FIGS. 4A and 5A are top views of two fully fabricated silicon chips 401 and 501 ready for packaging. Embodiments of this invention solve the problem of aligning the faces of two chips as in Flip Chip technology and described in the background section above. The problem is the alignment accuracy of two chips. Typically, alignment accuracy between two chips is 50 microns. Hence, the pitch of the pads is 100 microns, which limits the number of pads on a 1 $cm^2$ chip to 10,000. According to embodiments of this invention, a structure and method of aligning two chips, such as chips 401 as in FIGS. 4A and 4B and 501 as in FIGS. 5A and 5B, face-to-face as in the combination of chips 601 of FIGS. 6A and 6B. An alignment accuracy substantially the same as aligning mask layers made during a wafer fabrication process, which is usually 0.5F, where F is the minimum feature size of geometric patterns formed on a wafer to form transistors, results.

In one embodiment, the seamless integration process starts with forming four square holes 402 on a first chip 401. The holes 402 are inverted pyramids that appear like a V-groove 403 in a sectional view of the first chip shown in FIG. 4B. The holes 402 may be formed using chip fabrication technology to ensure alignment of the edge of the holes or V-grooves to the metal patterns (not shown) inside the chip as accurately as other mask alignments during the wafer fabrication process.

FIG. 5A is a top view of four semi-hemispheric balls 502 formed on a second chip 501. FIG. 5B shows a section view of the second chip 501 and ball 503 from among the semi-hemispheric balls 502. The ball 502 may be formed using the same process as used in forming Ball Grid Arrays or BGA's. Alignment of the balls 502 to the metal patterns inside the chip 501 is thus substantially as accurate as the alignment accuracy of mask layers used during the fabrication of the wafer from which the chip 501 is made. If F is the minimum feature size in wafer processing, alignment accuracy of 0.5F can be obtained by the ball/V-groove arrangement. For example, if F is 100 nm, then alignment accuracy of the ball 503 to metal patterns (not shown) in the chip 501 can be 50 nm. The size of the holes 402 or the V-groove 403 in the first chip 401 is 100 microns wide. The size of the balls 502 or 503 in the second chip 501 is 100 microns or smaller. FIG. 6A is a top view of an assembly of the first chip 401 of FIGS. 4A and 4B and the second chip 501 of FIGS. 5A and 5B, indicated as chip 602 of the chips 601, with the semi-hemispheric ball 603 self-aligned and well centered in the V-grooves 604 according to an embodiment of the present invention.

As illustrated in FIG. 6B, a second chip 607 is aligned roughly face-to-face to a first chip 605 so that balls 608 line-up approximately over a V-groove 606 using standard aligning equipment in the packaging facility, which has sub 100 micron alignment accuracy. At this point, the second chip 607 is brought in contact with the first chip 605 and allowed to self-align itself by the balls 608 sliding along the surface of the V-grooves 606 and stopping when the balls 608 are touching all four surfaces of the V-grooves 606. Hence, even though aligning equipment, which may include sonic vibration equipment, aligns the balls with an accuracy of 100 microns, self-alignment of the balls 608 to the V-grooves 606 allows for aligning accuracy for conductive pads (see FIG. 16B) the same as that of the V-grooves 606 to the internal metal patterns (not shown) on the first chip 605 and the balls 608 to the internal metal patterns (not shown) of second chip 607. Generally, the balls 608 and V-grooves 606 are not conductive, but, rather, provide for agreement between the chips. The materials for the balls may include glass or other insulation material.

FIGS. 7A and 7B are the same as FIGS. 4A and 4B with respect to similar reference numbers described above in the latter figures.

FIGS. 8A and 8B are enlarged views of areas 703 and 704 of FIGS. 7A and 7B, respectively. FIG. 8A is a top view of a first chip 801 illustrating a hole 802 defined within a top layer 804. The first chip 801 also includes posts 803 over metal lines (not shown) inside the chip 801 with minimum geometry. If the same equipment is used to align the hole 802 to the posts 803 as is used to align other mask layers, then the hole 802 is aligned to the posts 803 with the same accuracy.

FIG. 8B is a sectional view of FIG. 8A. An insulator 804 (i.e., the top layer) is formed (e.g., deposited) on a silicon layer 805. A substantially square or other geometric shaped hole 802 is defined in the insulator 804 through anisotropic etching techniques. The silicon layer 805 is etched to form the hole 806 using an anisotropic etch solution, such as KOH. The etching forms the V-groove 806 and stops as understood in the art and as described in "Single-Mask Micro Fabrication of a Spherical Optics Using KOH Anisotropic Etching of Silicon," D. W. de Lima Monteiro, O. Akhzar-Mehr, P. M. Sarro and G Vdovin Electronic Instrumentation Laboratory, Delft University of Technology, Mekelweg 4, 2628 CD Delft, The Netherlands, the entire teachings of which are incorporated by reference. Substantially no undercut below the insulator 804 takes place, and a depth of the V-groove depends on the dimensions through the insulator 804 defining an uppermost part (i.e., mouth) of the V-groove 806 of the hole 802. A slope of the V-groove 806 is fixed by the crystal orientation of the silicon in the silicon layer 805. For 100-orientation silicon, a typical angle of the slope is 54.75°, as described in de Lima Monteiro et al. The posts 803 and 807 are formed during the wafer fabrication process during multilevel metal depositions and etchings.

FIGS. 9A and 9B are same as FIGS. 8A and 8B. FIGS. 10A and 10B are enlarged top and profile views, respectively, illustrating areas 902 and 904 of FIGS. 9A and 9B, respectively. FIG. 10A shows details of the area 902 surrounding a post or conductive pad (interchangeably used herein) 803 of FIG. 9A. FIG. 10B shows details of a sectional view of section AA' of FIG. 10A of a multilevel interconnect 1013 below a post 1002 corresponding to the post 803 in FIG. 9A. Three levels of metals with two vias are shown in FIGS. 10A and 10B. In FIG. 10A, reference number 803 references a post, reference number 1002 references a third metal, reference number 1003 references a second via, reference number 1004 references a second metal, reference number 1005 references a first via and reference number 1006 references a first metal. FIG. 10B shows a sectional view along the section AA' of FIG. 10A. In FIG. 10B, reference number 1008 references a third metal, reference number 1009 references a second via, reference number 1010 references a second metal, reference number 1011 references a first via and reference number 1012 references a first metal. In modern silicon wafer fabrication technology, vias and posts may be the same and made with either tungsten or copper using a chemical mechanical planarization (CMP) process. A CMP process can be used to deposit metal or an insulator on an uneven surface and planarize it using chemical and mechanical polishing techniques.

FIGS. 11A and 11B are top and sectional views of a second chip. FIGS. 12A and 12B are enlarged views of areas 1101 and 1102 of FIGS. 11A and 11B, respectively. FIG. 12A shows a ball 1201 aligned a distance d from a post 1202 using wafer fabrication alignment tools. The misalignment of the ball 1201 to the post 1202 is 0.5F, where F is the minimum feature size of geometric patterns formed on the wafer to form transistors. In FIG. 12B, construction of the ball 1201 of FIG. 12A is shown, where a hemispherical section 1204 is constructed or adhered to a round pad 1203 formed on an insulator 1205. The round pad 1203 may be a composite layer of tungsten gold and lead-tin or other similar metals. In one embodiment, by heating the wafer, lead-tin forms a perfect semi-sphere, which may be a hemisphere.

FIGS. 13A and 13B are the same as FIGS. 12A and 12B, respectively. FIGS. 14A and 14B are enlarged views of areas 1301 and 1302 of FIGS. 13A and 13B, respectively. FIGS. 14A and 14B illustrate an example of multilevel metal interconnect inside a second chip (e.g., the second chip 607 of FIG. 6A). In FIG. 14A, reference number 1401 references a ball, reference number 1402 references a third metal, reference number 1403 references a second via, reference number 1404 references a second metal, reference number 1405 references a first via and reference number 1406 references a first metal. In FIG. 14B, reference number 1407 references a ball, reference number 1408 references a third metal, reference number 1409 references a second via, reference number 1410 references a second metal, reference number 1411 references a first via and reference number 1412 references a first metal.

FIG. 16A and FIG. 16B are enlarged views of areas 1503 and 1504 of FIGS. 15A and 15B, respectively, which are the same as FIGS. 6A and 6B, respectively, after a second chip 1502 is placed over a first chip 1501. A ball 1602 coupled to the second chip 1502 is guided by the sloping sidewall of the V-groove 1601 into a self-aligned position. To illustrate the movement of the second chip 1502 over the first chip 1501 in FIG. 15A, an outline of two surfaces 1701, 1702 that face each other are shown in FIG. 17 at a final resting position. FIG. 17 is enlarged in FIGS. 18A-18C.

Figure 2A:
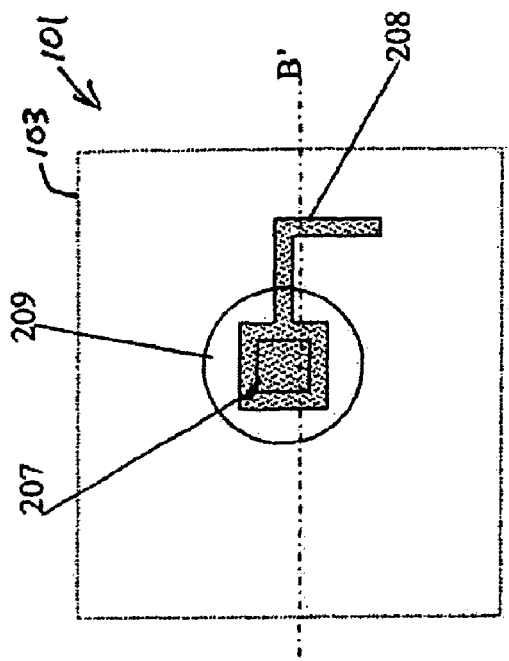
FIG. 2A is a top view of an enlarged area 103 of an interconnect metal of the chip.
Figure 2B:
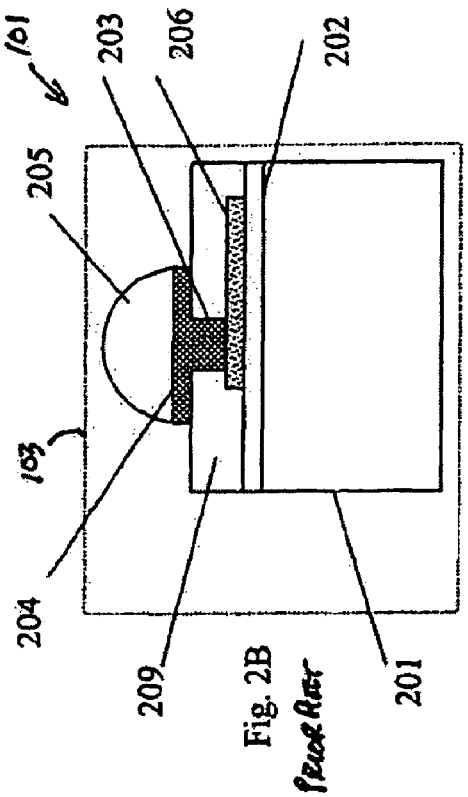
FIG. 2B is the view of the enlarged area of FIG. 2A showing details of a layout of the interconnect metal.
Figure 1A:
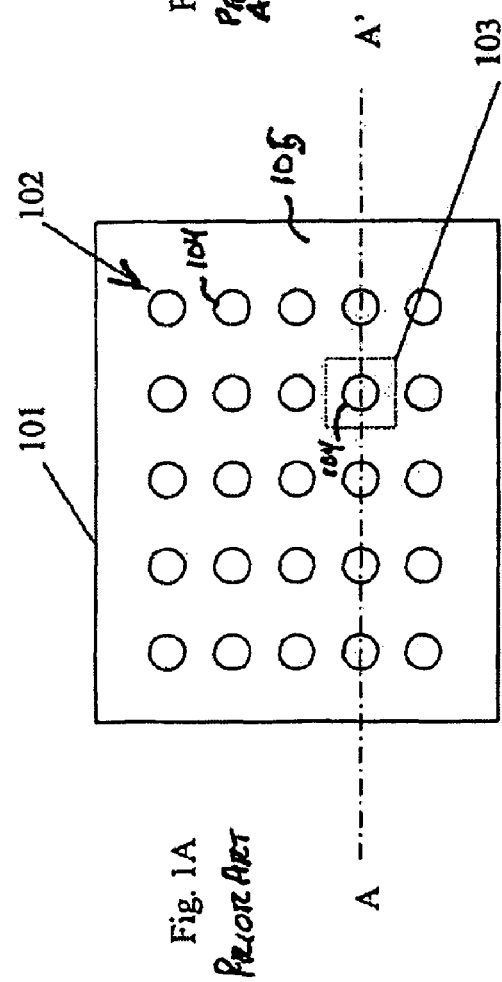
FIG. 1A is the top view of a chip with state of the art Flip Chip technology.
Figure 1B:
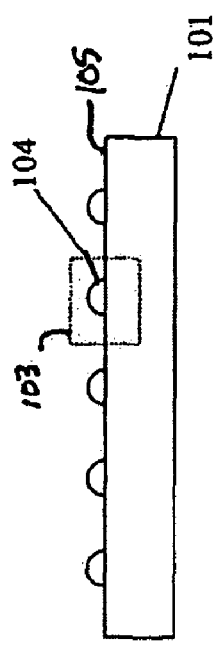
FIG. 1B is a sectional view of the chip in FIG. 1A along section AA'.

In FIG. 18A, two surfaces 1801 and 1802 are roughly aligned. This rough alignment process may be performed using conventional or custom equipment to position the first and second surfaces 1801 and 1802 with very little space between them (e.g., less than 100 nm). Such a positioning process is commonly performed in chip manufacturing with the aid of a microscope. Area 1805A in FIG. 18A is enlarged in 1805AA of FIG. 18A-1, which shows posts 1807 on the first chip and posts 1808 on the second chip. Once the ball 1803 is inside the V-groove 1804, it slides down to a resting position, as illustrated in FIGS. 18B and 18C. FIGS. 18A-1, 18B-1 and 18C-1 show posts or conductive pads 1807 and 1808 come to a substantially aligned position within an accuracy of 0.5F, where F is the smallest feature size inside a chip. In FIG. 18A-2, upper posts 1808 are several microns misaligned from lower posts 1807. In FIG. 18C-1, the posts are substantially self-aligned as a result of a mating between the balls and V-grooves. An ultrasonic vibration may also be applied to the chips to further cause the chips to self-align. If the chips are placed together with an accuracy of 10 microns, then movement between the chips using vibration or otherwise may be a maximum of 5 microns or less. In the case of using gravity in the self-alignment process, the vibrations, if used, cause the balls 1803 top chip to slide to the bottom of the V-grooves 1804, which causes the posts 1808 and 1807 to slide and contact one another. Heating the two chips to bond the metal posts completes assembly of the two chips. Metal, like copper, bonds or fuses around 400° C. Other bonding techniques, such as chemical bonding or heat and pressure, may be utilized to cause the metal posts (i.e., conductive pads) to bond.

A second embodiment of the invention is shown in FIGS. 19A-22C. A second chip 1902 is placed over a first chip 1901, as in the top view in FIG. 19A and the sectional view in FIG. 19B. FIGS. 20A and 20B are enlarged views of areas 1903 and 1904, respectively. Construction of the first chip 1901 is the same as described earlier in reference to FIGS. 7, 8, 9 and 10. Construction of the second chip 1902 is shown in FIGS. 20A and 20B. A thick layer of glass 2004 is deposited over the wafer surface 2003. A tall cylindrical pillar 2005 is etched with a diameter smaller than the width of the V-groove 2001. The height of pillar 2005 is determined by the depth of the groove 2001, the thickness of the insulators 2006, 2003, and the height of posts 2007. In addition to using a pillar having a circular shape, it should be understood that any shape, such as a square, oval, octagonal or otherwise, that enable the chips to self-align may be utilized.

Surface profiles 2101 and 2102 of the two chips 1901 and 1902 of FIG. 19 are shown in FIG. 21. To illustrate the movement of the second chip 1902 over the first chip 1901 of FIGS. 19A and 19B, an outline of two surfaces 2101, 2102 that face each other as shown in FIG. 21 at their final resting positions are enlarged in FIGS. 22A-22C to show different respective positions.

In FIG. 22A, the two surfaces 2201 and 2202 are roughly aligned. An area 2205 in FIG. 22A is enlarged in area 2206 of FIG. 22A-1, which shows posts 2207 on the first chip 2101 and the posts 2208 on the second chip 2102. Once the pillar 2204 is inside the V-groove 2203, it slides down to a resting position, as illustrated in FIGS. 22B and 22C.

FIGS. 22A-1, 22B-1 and 22C-1 show the posts 2207 and 2208 come to a substantially aligned position within an accuracy of 0.5F, where F is the smallest feature size inside a chip. In FIG. 22A-1, posts 2208 are several microns misaligned from posts 2207. In FIG. 22C-1, the posts 2207 and 2208 are substantially self-aligned. Heating the two chips 2101 and 2102 to bond the metal posts 2208 may complete assembly of the two chips 2101 and 2102. Metal, like copper, bonds around 400° C.

A third embodiment of the present invention is shown in FIGS. 23A and 23B. A first chip 2301 and a second chip 2302 are constructed in the same way as described in reference to FIGS. 7, 8, 9 and 10. In this example, the V-grooves 2303 and 2304 are 100 microns wide. A spherical micro-ball 2305, made with any suitable metal or glass, is placed inside the groove 2303 of the first chip 2301. The diameter of the ball 2305 is smaller than the size of the V-groove 2303. One of the methods of placing balls 2305 in the grooves 2303 may include flooding the surface of the first chip 2301 with many micro-balls until four grooves on the first chip 2301 are filled. It should be understood that the grooves on the first chip 2301 may be filled with balls for the self-alignment process to operate in accordance with this embodiment of the present invention. The second chip 2302 is roughly aligned to the first chip 2301 so that the micro-ball 2305 is slightly inside the V-groove 2304 in the second chip 2302. As the second chip 2302 is lowered, by gravity in one embodiment, it is guided by the surface of V-groove 2304 until it arrives at a final resting position. The second chip 2302 is self-aligned to the first chip 2301 within the accuracy of the diameter of the micro-ball. For example, if the diameter can be controlled within 1 micron, then the accuracy of alignment is 1 micron. The V-grooves 2303 and 2304 are aligned to the posts 2306 and 2307, respectively, by using state of the art chip fabrication methods, such as masking, photolithography, and etching of insulators and silicon. State of the art silicon fabrication methods enable alignment accuracy of 100 mm today. Hence, misalignment of the posts 2306 and 2307 on the first and second chips 2301 and 2302 is limited by the accuracy of the ball diameter tolerance. Balls with sub-micron accuracy are available today commercially.

Figure 24:
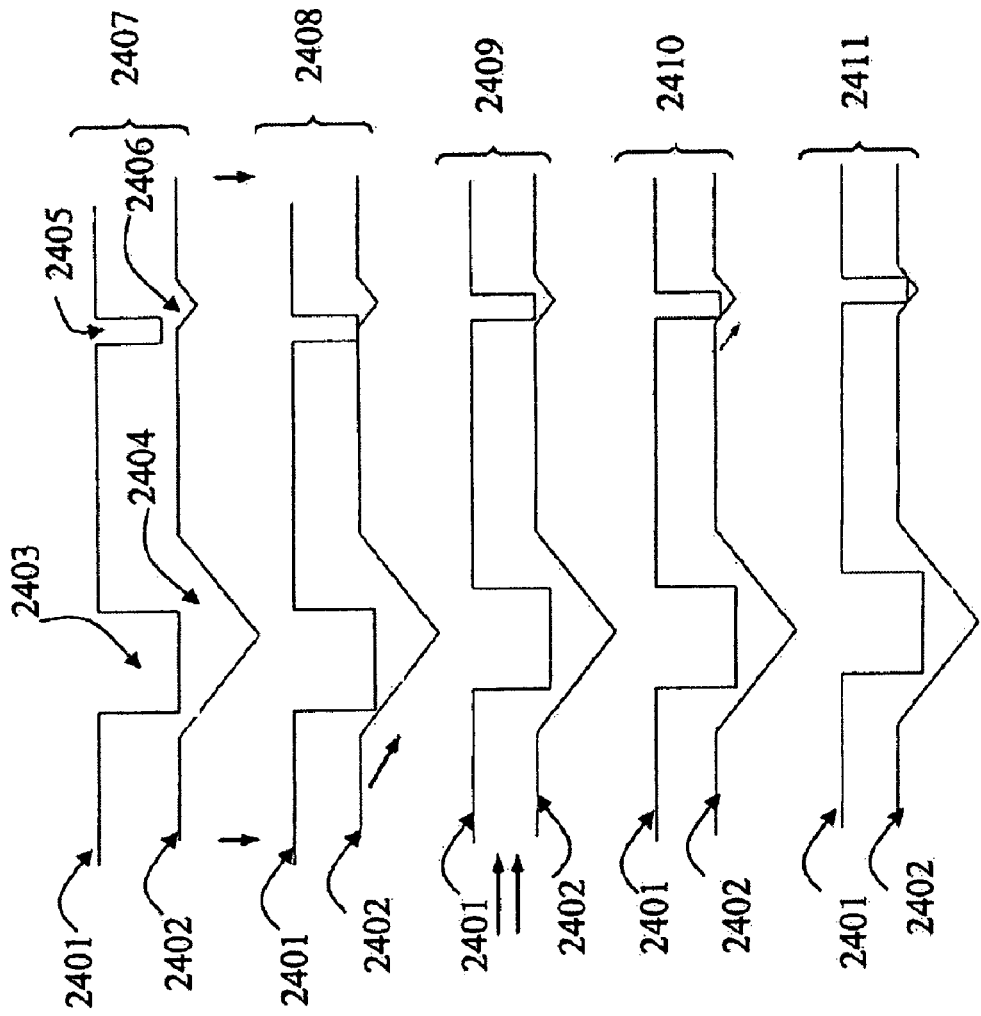
FIG. 24 is a profile diagram of two chips with two grooves, where one of the grooves is a deep groove for initial alignment and at least one other groove is shallow a groove for fine(r) alignment.

A fourth embodiment is shown in FIG. 24. A first chip 2401 and second chip 2402 are the pair of chips face-to-face with two alignment pillars 2403 and 2405, having different diameters, on the first (top) chip 2401, as well as two (wide and narrow) alignment grooves 2404 and 2406 corresponding to the two aligned pillars 2403 and 2405 and on the second (bottom) chip 2402. This stage of alignment is noted as a first stage 2407. Once the rough alignment with existing tools is done at the first stage 2407, the wide pillar 2403 is on the top of the wide groove 2404, though it may be not be in right in the center of the groove as in the first stage 2407. In a second stage, 2408, the first chip 2401 is lowered until it touches the second chip 2402. At this point, the first chip 2401 is released to slide on its own towards the center of the wide groove 2404 until the narrow pillar 2405 touches the surface of the first chip 2401. At this point, sliding of the wide pillar 2403 stops. Now, as illustrated in a third stage in 2409, the first chip 2401 is pushed to the right along a plane until the narrow pillar 2405 is inside the narrow groove 2406. Now, in the fourth stage 2410, the first chip 2401 starts sliding again until the narrow pillar 2405 is right in the middle of the narrow V-groove 2406, as illustrated in a fifth stage 2411.

As depicted, the wide pillar 2403 does not touch the sides of the V-groove 2044 due to tolerance limitations. This example shows that the purpose of the narrow pillar 2405 and groove 2406 along with the wide pillar 2403 and groove 2404 is to increase the alignment accuracy in the event surfaces of wide grooves are not well controlled. One could use more than two different sized pillars and V-grooves if more accuracy is desired. It should be understood that the other pillar and V-groove interactions and post contacts maintain the two chips 2401 and 2402 in a substantially horizontal orientation.

A fifth embodiment is also contemplated where a top chip and bottom chip have two wide V-grooves and two narrow V-grooves. The bottom chip may be flooded with small and large balls to fit inside wide and narrow grooves. The top chip is aligned over the bottom chip roughly using existing tools and lowered until the wide grooves touch large balls and start sliding downwards until the surface of the narrow V-grooves of the top chip touches the small balls. At that point, the top chip is pushed laterally along a plane until the small balls are inside the small grooves of the top chip and starts sliding again until the small balls are in the center of the narrow grooves of the bottom chip.

Figure 25A:
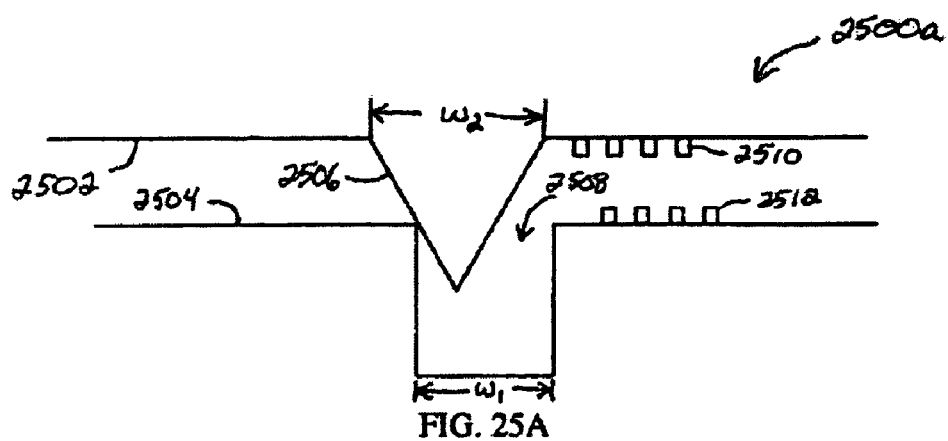
FIGS. 25A and 25B are illustrations of two chip configurations showing a first chip and second chip being self-aligned.
Figure 25B:
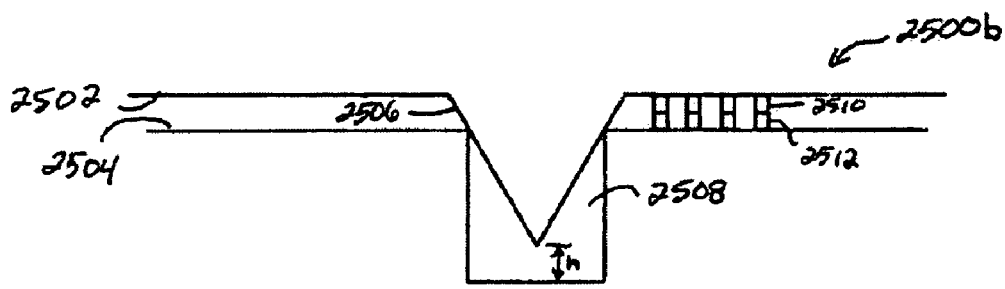

FIGS. 25A and 25B are illustrations of two chip configurations 2500a showing a first chip 2502 and second chip 2504 being self-aligned. In this embodiment, the second chip includes a pyramid structure 2506 deposited on or etched to extend from a surface of the first chip 2502 and the first chip 2504 includes an indentation 2508 in the form of a cube, rectangle, or other shape that enables the pyramid structure 2506 to self-align with the indentation 2508. The indentation has a width w, and the pyramid structure 2506 has a base width $w_2$ so that the pyramid structure 2506 slides into the indentation 2508, but does not touch the apex of the pyramid structure to the second chip 2504. First conductive pads 2510 on the first chip 2502 and second conductive pads 2512 on the second chip 2504 are configured in pitch and height such that the first and second conductive pads 2510 and 2512 contact one another when the pyramid structure 2506 is self-aligned with the indentation 2508. As shown, there is a height h between the apex of the pyramid structure 2506 and second chip 2504. It should be understood that first and second chips 2502 and 2504 could be reversed in position.

Figure 26:
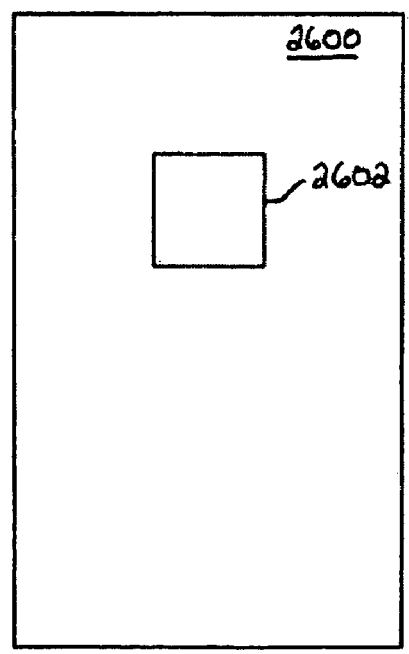
FIG. 26 is a block diagram of an exemplary system including a device having multiple chips being connected.

FIG. 26 is a block diagram of an exemplary system 2600 including a device 2602 having multiple chips being connected using the principles of the present invention. The system 2600 may be any system that can integrate the device 2602. For example, the system may be a computing device (e.g., computer, calculator), communication device (e.g., mobile wireless device, modem), gaming device (e.g., handheld game, video game), automobile component (e.g., controller), or any other system.

Figure 27:
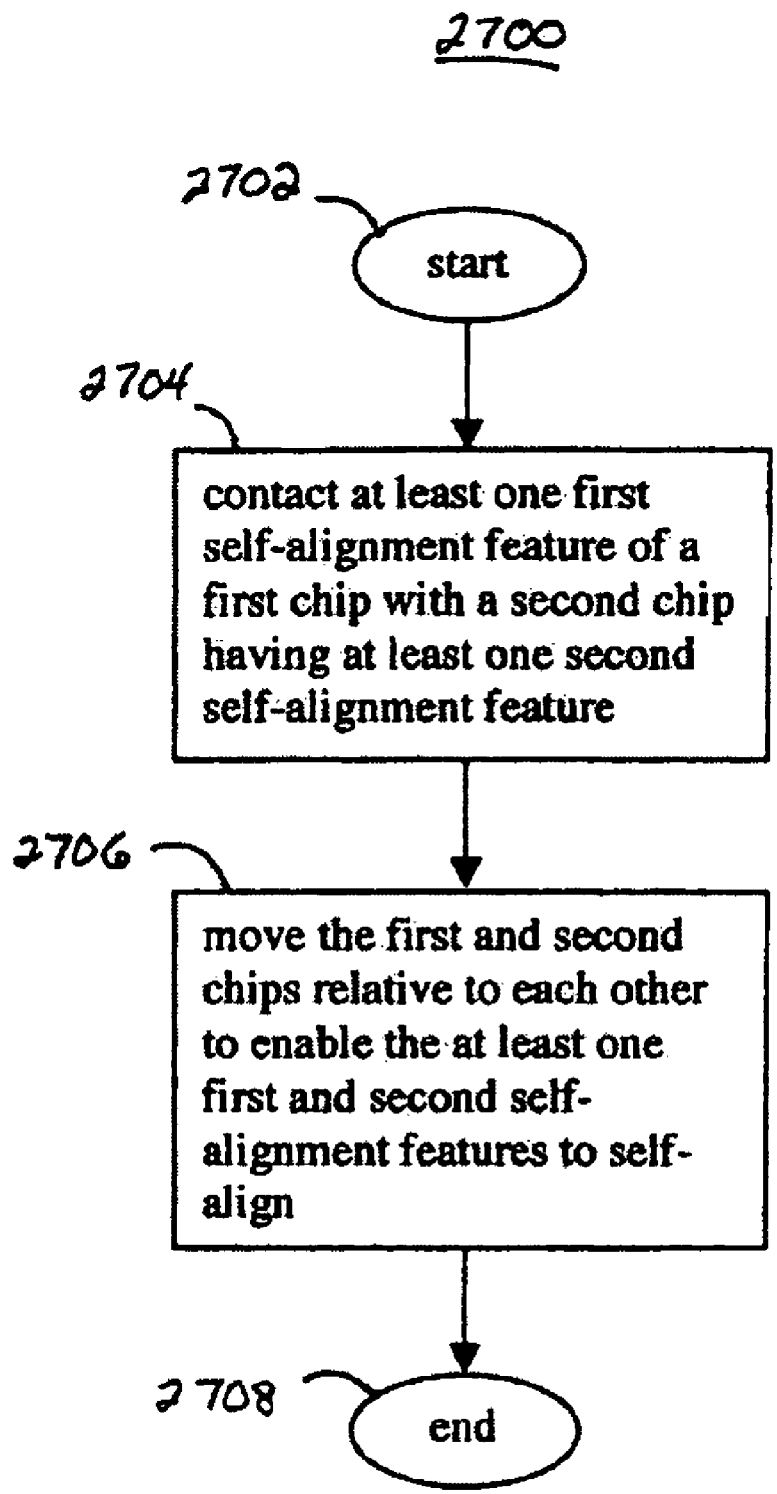
FIG. 27 is a flow diagram of an exemplary process for aligning two chips.

FIG. 27 is a flow diagram of an exemplary process 2700 for aligning two chips. The self-alignment process 2700 starts at step 2702. At step 2704, at least one first self-alignment feature of a first chip may be contacted with a second chip having at least one second self-alignment feature. The self-alignment features may be any features, including indentations (e.g., inverted pyramid) and protrusions (e.g., semi-spherical ball, circular pillar), which enable the features to self-align when placed together. In one embodiment, gravity assists in performing the self-alignment between the at least one first and second alignment features. At step 2706, the first and second chips are moved relative to each other to enable the at least one first and second self-alignment features to self-align. The movement may be performed horizontally or in a planar motion. Additionally and/or alternatively, the movement may include applying a vibration, such as an ultrasonic vibration, to cause the at least one first and second self-alignment features to self-align. The self-alignment process 2700 ends at step 2708.

Figure 28:
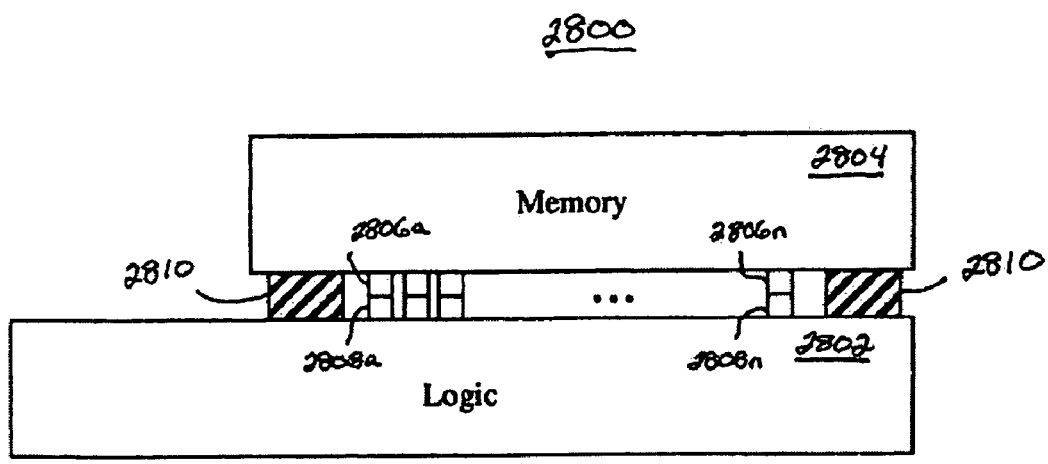
FIG. 28 is a block diagram of an exemplary device formed of a first chip produced by a first process and a second chip produced by a second process.

FIG. 28 is a block diagram of an exemplary device 2800 formed of a first chip 2802 produced by a first process and a second chip 2804 produced by a second process. In one embodiment, the first chip 2802 is a logic chip and the second chip 2804 is a memory chip. The first chip 2802 includes first conductive pads 2806a-2806n (collectively 2806) and the second chip 2802 includes second conductive pads 2808a-2808n (collectively 2808). As shown, the first conductive pads 2806 and second conductive pads 2808 are aligned using self-alignment features 2810 (e.g., pillars that align with V-grooves (not shown)) and bonded together by a heat process.

In operation, the first chip 2802 communicates electrical signals 2812 with the second chip 2804 via the bonded first and second conductive pads 2806 and 2808. For example, a logic chip may communicate electrical signals with a memory chip to store and retrieve data. The electrical signals may be digital or analog depending on the technology of the chips that are connected together. In one embodiment, the first chip 2802 may be adapted to work with different chip types. For example, the first chip 2802 may be a logic chip, such as a processor, that can work with different types of memory chips, such as DRAM, SRAM, flash, or other types of memory. Because these different memories may have different communication protocols, each of the memory chips may have a different configuration of the conductive pads so that the logic chip may automatically detect which type of memory chip is connected thereto and adapt the communication protocol for that specific memory chip.

More specifically, two conductive pads may be used for indicating the memory type. The indications may be in the form of high logic signals, low logic signals, capacitance, inductance, short signal, or other forms of static or dynamic electronic programming means known in the art. These two conductive pads may provide for four different memory types depending on the inputs (e.g., '00' is DRAM, '01' is SRAM, '11' is flash, and '10' is EEPROM). Still yet, the memory may include data stored in memory registers that the logic reads to determine the type of memory to which it is connected. It should be understood that the same type of automatic detection of device connections may be performed with other types of chips.

In some embodiments, the conductive pads for the different chips have different number of connections such that a different subset of the conductive pads of the first chip 2802 are connected to conductive pads on the second chip 2804 depending on the type of the second chip. It is contemplated that a standard interconnect pattern may be developed for the interconnection between different chip types (e.g., logic and DRAM, logic and SRAM, logic and flash, and so forth).

It should be understood that the combination of chips found through any of the aforementioned techniques may be used in any electronics application, such as computers, mobile phones, wireless devices, calculators, automobile electronics, general or application specific processors, and so forth. Although specific embodiments have been shown and described, alternative embodiments for self-aligning two chips with the tolerances described herein in accordance with the principles of the present may be utilized. For example, instead of relying on gravity, the two chips may be vertically arranged and moved together through use of sensitive robotics.

The previous description is of example embodiments for implementing the principles of the present invention, and the scope of the invention should not necessarily be limited by this description. The scope of the present invention is instead defined by the following claims.

What is claimed is:

1. A method of manufacturing a chip, comprising:
   forming (i) first electrical components, (ii) a plurality of first conductive pads having first top surfaces with predefined dimensions, and (iii) at least one first alignment structure on a first substrate using a first chip manufacturing process, the at least one first alignment structure arranged to be aligned with at least one second alignment structure on a second substrate having a plurality of second conductive pads disposed thereon by a second chip manufacturing process and having second top surfaces with substantially the same dimensions as the first conductive pads;

contacting at least a subset of the first and second top surfaces by aligning the at least one first alignment structure on the first substrate with the at least one second alignment structure on the second substrate; and causing the at least the subset of the first and second conductive pads to bond together.

2. The method according to claim 1, wherein forming the first alignment structure includes forming an indentation on the first substrate.

3. The method according to claim 2, wherein forming the indentation includes forming an inverted pyramid.

4. The method according to claim 2, wherein forming the indentation includes forming a geometric shape within the substrate configured to provide self-alignment with a differently shaped at least one second alignment structure formed on the second chip or with a separate component configured to be disposed within the geometric shape.

5. The method according to claim 1, wherein forming the conductive pads includes forming conductive pads having a pitch less than approximately 100 microns.

6. The method according to claim 1, wherein forming the conductive pads includes forming conductive pads having a pitch less than approximately 10 microns.

7. The method according to claim 1, wherein forming the conductive pads includes forming conductive pads having a pitch less than approximately 1 micron.

8. The method according to claim 1, wherein forming the conductive pads includes forming conductive pads having a surface area less than approximately 10 square microns.

9. A method for aligning a first and a second chip, said method comprising:

contacting at least one first self-alignment feature of a first chip with at least one second self-alignment feature of a second chip, the first chip and second chip having a plurality of conductive pads having top surfaces of approximately the same dimensions; and moving the first and second chips relative to each other to enable the at least one first and second self alignment features to self align in a manner causing at least a subset of the top surfaces of the first and second conductive pads to contact one another.

10. The method according to claim 9, wherein said moving is performed along a plane and the self-alignment of the at least one first and second self alignment features is performed in a direction other than along the plane.

11. The method according to claim 9, wherein moving the first and second chips relative to each other enables the at least one first and second self alignment features to gravitationally self-align.

12. The method according to claim 9, wherein contacting the at least one first self-alignment feature of the first chip with the second chip includes contacting at least one semi-hemispheric feature with the second chip.

13. The method according to claim 12, wherein moving the first and second chips relative to each other includes moving the semi-hemispheric feature of the first chip along the second chip until the at least one semi-hemispheric feature slides into at least one indentation having a self aligning geometric shape in the second chip.

14. The method according to claim 9, wherein moving the first and second chips relative to each other includes moving the chips a maximum distance less than 5 microns.

15. The method according to claim 9, wherein moving includes ultrasonically vibrating the two chips to self align the at least one first and second self-alignment features.

16. A method of aligning a first chip with a second chip, said method comprising:

positioning a first chip formed with at least one first alignment feature and a plurality of first conductive pads having first top surfaces with predetermined dimensions;

positioning a second chip formed with at least one second alignment feature and a plurality of second conductive pads having second top surfaces with the substantially same dimensions as the first top surfaces; and moving at least one of the first and second chips relative to the other chip to align the at least one first and second alignment features to cause at least a subset of the first and second conductive pads to be aligned in a manner such that the respective first and second top surfaces contact one another.

17. The method according to claim 16, wherein moving at least one of the first and second chips relative to the other chip is performed along a plane.

18. The method according to claim 16, wherein moving at least one of the first and second chips relative to the other chip causes the at least one first and second alignment features to self align with respect to one another to cause at least a subset of the first and second conductive pads to contact.

19. The method according to claim 18, wherein moving at least one of the first and second chips relative to the other chip causes the at least one first and second alignment features to gravitationally self align.

20. The method according to claim 16, wherein moving at least one of the first and second chips relative to the other chip causes at least one of the chips to move a maximum of 5 microns.

21. The method according to claim 16, further comprising ultrasonically vibrating the first and second chips to cause the at least one first and second alignment features to self-align.

22. The method according to claim 16, further comprising providing first and second chips having a maximum substrate dimension of approximately 3 square centimeters.

23. A method of communicating signals between chips, comprising:

communicating electrical signals between a first chip and a second chip, the electrical signals passing from a first conductive pad disposed on the first chip to a second conductive pad disposed on the second chip, at least a subset of the first and second conductive pads being in contact with one another and bonded together, and providing for the electrical signals to be communicated between the first and second chips at a clock rate substantially the same as on one of the chips.

24. The method according to claim 23, wherein communicating the electrical signals between the first and second chips via the bonded first and second conductive pads is performed at a minimum rate of approximately 200 MHz.

25. The method according to claim 23, wherein communicating the electrical signals between the first and second chips via the bonded first and second conductive pads is performed at a minimum rate of approximately 1 GHz.

26. The method according to claim 23, wherein communicating the electrical signals between the first and second chips via the bonded first and second conductive pads is performed at a minimum rate of approximately 2 GHz.

27. The method according to claim 23, wherein communicating includes writing data to a memory from the first chip to the second chip via the bonded first and second conductive pads.

28. The method according to claim 27, wherein writing data is performed from the first chip that includes processing functionality.

29. The method according to claim 23, wherein communicating the electrical signals between the first and second chips via the bonded first and second conductive pads is performed between conductive pads having connectivity greater than 1E05 per square centimeter.

30. The method according to claim 23, further comprising automatically determining, by the first chip, the chip type of the second chip.

* * * * *